(12) United States Patent
Kudoh

(10) Patent No.: US 11,528,437 B2
(45) Date of Patent: Dec. 13, 2022

(54) IMAGING DEVICE AND ELECTRONIC EQUIPMENT

(71) Applicant: SONY SEMICONDUCTOR SOLUTIONS CORPORATION, Kanagawa (JP)

(72) Inventor: Yoshiharu Kudoh, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 49 days.

(21) Appl. No.: 16/964,669

(22) PCT Filed: Mar. 8, 2019

(86) PCT No.: PCT/JP2019/009269
§ 371 (c)(1),
(2) Date: Jul. 24, 2020

(87) PCT Pub. No.: WO2019/181555
PCT Pub. Date: Sep. 26, 2019

(65) Prior Publication Data
US 2021/0058578 A1 Feb. 25, 2021

(30) Foreign Application Priority Data
Mar. 22, 2018 (JP) .............................. JP2018-053911

(51) Int. Cl.
*H04N 5/374* (2011.01)
*H01L 27/146* (2006.01)
(Continued)

(52) U.S. Cl.
CPC ....... *H04N 5/374* (2013.01); *H01L 27/14643* (2013.01); *H01L 24/48* (2013.01);
(Continued)

(58) Field of Classification Search
CPC ......... H01L 27/14614; H01L 27/14636; H01L 27/1464; H01L 27/14656; H01L 27/14612;
(Continued)

(56) References Cited

U.S. PATENT DOCUMENTS 9,706,142 B2 * 7/2017 Hynecek ........... H01L 27/14656
10,388,681 B2 * 8/2019 Ohri .................... H01L 27/1464
(Continued)

FOREIGN PATENT DOCUMENTS

JP 2003-087663 3/2003
JP 2009-296574 12/2009
(Continued)

OTHER PUBLICATIONS

International Search Report and Written Opinion prepared by the Japanese Patent Office dated May 31, 2019, for International Application No. PCT/JP2019/009269.

*Primary Examiner* — David A Zarneke
(74) *Attorney, Agent, or Firm* — Sheridan Ross P.C.

(57) ABSTRACT

The present technology relates to an imaging device of global shutter type, and relates to an imaging device and electronic equipment capable of inhibiting interference between a photoelectric conversion unit and an element that holds charge that has been transferred from the photoelectric conversion unit. An imaging device includes, in a pixel: a photoelectric conversion unit; a charge transfer unit; an electrode that is used to transfer charge from the photoelectric conversion unit to the charge transfer unit; a charge-voltage conversion unit; and a charge drain unit. Here, the charge transfer unit is allowed to transfer charge in a first transfer direction to the charge-voltage conversion unit and a second transfer direction to the charge drain unit. The
(Continued)

present technology can be applied to, for example, a CMOS image sensor of global shutter type.

12 Claims, 23 Drawing Sheets

(51) Int. Cl.
  *H04N 5/369* (2011.01)
  *H01L 23/00* (2006.01)
(52) U.S. Cl.
  CPC ........ *H01L 27/146* (2013.01); *H01L 27/1464* (2013.01); *H01L 27/14603* (2013.01); *H01L 27/14609* (2013.01); *H01L 27/14612* (2013.01); *H01L 27/14614* (2013.01); *H01L 27/14656* (2013.01); *H01L 27/14676* (2013.01); *H01L 2924/00* (2013.01); *H04N 5/3698* (2013.01)

(58) Field of Classification Search
  CPC ......... H01L 27/14643; H01L 27/14603; H01L 27/14609; H01L 27/146
  See application file for complete search history.

(56) References Cited

U.S. PATENT DOCUMENTS

| | | | |
|---|---|---|---|
| 10,431,622 B2 * | 10/2019 | Yamashita | ............ H01L 27/146 |
| 2011/0007196 A1 | 1/2011 | Yamashita et al. | |
| 2013/0206964 A1 | 8/2013 | Yamashita et al. | |
| 2014/0084143 A1 | 3/2014 | Sakano et al. | |
| 2016/0254305 A1 | 9/2016 | Sakano et al. | |
| 2018/0220092 A1 | 8/2018 | Takaya et al. | |

FOREIGN PATENT DOCUMENTS

| | | |
|---|---|---|
| JP | 2013-021533 | 1/2013 |
| JP | 2017-076899 | 4/2017 |

* cited by examiner

IMAGING DEVICE AND ELECTRONIC EQUIPMENT

CROSS REFERENCE TO RELATED APPLICATIONS

This application is a national stage application under 35 U.S.C. 371 and claims the benefit of PCT Application No. PCT/JP2019/009269 having an international filing date of 8 Mar. 2019, which designated the United States, which PCT application claimed the benefit of Japanese Patent Application No. 2018-053911 filed 22 Mar. 2018, the entire disclosures of each of which are incorporated herein by reference.

TECHNICAL FIELD

The present technology relates to an imaging device and electronic equipment, and particularly to an imaging device and electronic equipment compatible with a global shutter.

BACKGROUND ART

CMOS image sensors adopt a rolling shutter type or a global shutter type.

In a CMOS image sensor of rolling shutter type, exposures of pixels are sequentially performed in units of rows. That is, after a predetermined period of time after resetting charge of a photodiode in a pixel and starting accumulation of the charge, the operations of reading the charge accumulated in the photodiode are sequentially performed in units of rows at different times. Consequently, since exposure periods of time of pixels are different row by row, distortion particularly occurs in an image of a subject moving fast.

In contrast, in a CMOS image sensor of global shutter type, exposures of all pixels are collectively performed. For example, in a CMOS image sensor of global shutter type, a charge holding unit that holds charge is provided in each pixel in addition to a photodiode. Then, after a predetermined period of time after resetting charge of a photodiode in a pixel and starting accumulation of the charge, the operations of reading the charge accumulated in the photodiode in the charge holding unit are simultaneously performed in all pixels. Then, the charges held (accumulated) in the charge holding unit are sequentially read in units of rows. Consequently, since the exposure periods of time of pixels are unified, the distortion of an image of a subject is inhibited (e.g., see Patent Document 1).

CITATION LIST

Patent Document

Patent Document 1: Japanese Patent Application Laid-Open No. 2004-111590

SUMMARY OF THE INVENTION

Problems to be Solved by the Invention

In a CMOS image sensor of global shutter type, charges of different frames are accumulated in a photodiode and a charge holding unit. Consequently, if there occurs interference, which is a phenomenon of charge overflowing from one of the photodiode and the charge holding unit flowing into the other, image quality deteriorates.

The present technology has been made in view of such a situation, and can inhibit interference between a photoelectric conversion unit such as a photodiode and an element that holds charge transferred from the photoelectric conversion unit.

Solutions to Problems

An imaging device of a first aspect of the present technology includes, in a pixel: a photoelectric conversion unit; a charge transfer unit; a first electrode that is used to transfer charge from the photoelectric conversion unit to the charge transfer unit; a charge-voltage conversion unit; and a first charge drain unit. Here, the charge transfer unit is allowed to transfer charge in a first transfer direction to the charge-voltage conversion unit and a second transfer direction to the first charge drain unit.

Electronic equipment of a second aspect of the present technology includes: an imaging device; and a signal processing unit that processes a signal output from the imaging device. Here, the imaging device includes, in a pixel: a photoelectric conversion unit; a charge transfer unit; an electrode that is used to transfer charge from the photoelectric conversion unit to the charge transfer unit; a charge-voltage conversion unit; and a charge drain unit, and the charge transfer unit is allowed to transfer charge in a first transfer direction to the charge-voltage conversion unit and a second transfer direction to the charge drain unit.

In the first aspect of the present technology, charge is transferred from the photoelectric conversion unit to the charge transfer unit, and charge is transferred in the first transfer direction from the charge transfer unit to the charge-voltage conversion unit or the second transfer direction to the first charge drain unit.

In the second aspect of the present technology, while a signal output from the imaging device is processed, charge is transferred from the photoelectric conversion unit to the charge transfer unit, and charge is transferred in the first transfer direction from the charge transfer unit to the charge-voltage conversion unit or the second transfer direction to the charge drain unit.

Effects of the Invention

According to the first or second aspect of the present technology, interference between a photoelectric conversion unit and an element that holds charge transferred from the photoelectric conversion unit can be inhibited.

MODE FOR CARRYING OUT THE INVENTION

An embodiment for carrying out the present technology (hereinafter, referred to as an embodiment) will be described below. Note that the description will be given in the following order.

1. Basic Configuration Example
2. First Embodiment
3. Second Embodiment (Example of Draining Charge by Controlling Height of Potential Barrier)
4. Third Embodiment (Example in Which Photodiode Is Disposed in Deep Part in Semiconductor Substrate)
5. Fourth Embodiment (Example in Which Charge Holding Unit Is Omitted)
6. Variations
7. Applications 1. Basic Configuration Example First, a basic configuration example of a CMOS image sensor, which is one example of an imaging device of global shutter type, will be described with reference to FIGS. 1 to 5.

<Configuration Example of CMOS Image Sensor 1>

Figure 1:
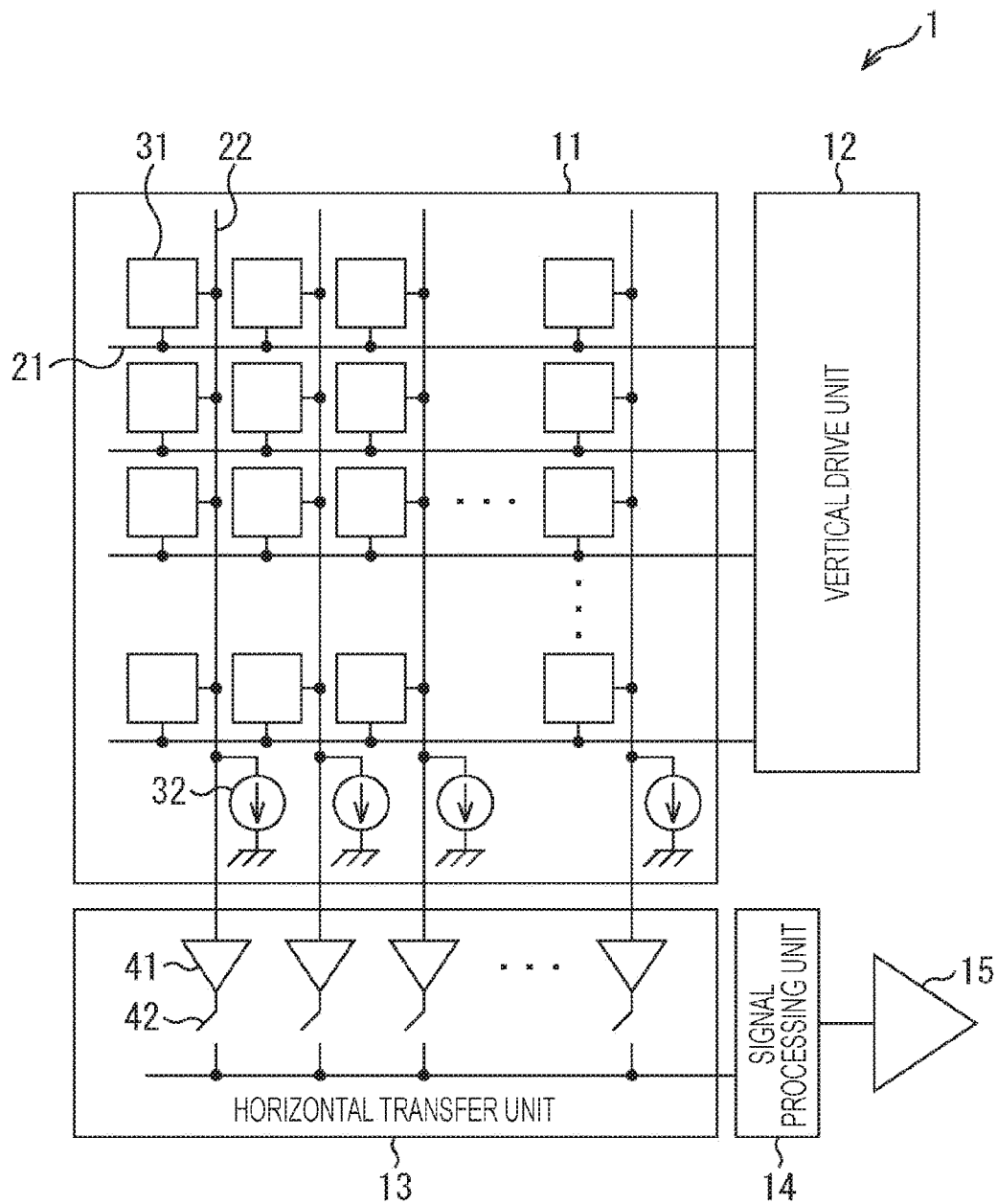
FIG. 1 is a block diagram illustrating a configuration example of a CMOS image sensor.

FIG. 1 is a block diagram illustrating a configuration example of a CMOS image sensor 1.

The CMOS image sensor 1 includes a pixel array unit 11, a vertical drive unit 12, a horizontal transfer unit 13, a signal processing unit 14, and an output buffer 15.

Unit pixels 31 are arranged in a matrix in the pixel array unit 11. The unit pixels 31 have a photoelectric conversion element that generates photocharge of a charge amount in accordance with an amount of incident light and accumulates the photocharge inside the photoelectric conversion element itself. Note that, hereinafter, the photocharge may be simply referred to as charge, and the unit pixels may be simply referred to as pixels.

Furthermore, in the pixel array unit 11, a pixel drive line 21 is formed for each row along a right-and-left direction (direction of a pixel row) in the figure, and a vertical signal line 22 is formed for each column along an up-and-down direction (direction of a pixel column) in the figure. One end of the pixel drive line 21 is connected to an output end, corresponding to each row, of the vertical drive unit 12. A current source 32 is connected to each vertical signal line 22.

Note that, although one pixel drive line 21 is illustrated for each row in the figure, the number of the pixel drive lines 21 is not limited to one.

The vertical drive unit 12 is a pixel drive unit that includes, for example, a shift register and an address decoder and that drives each pixel of the pixel array unit 11 simultaneously for all pixels or in units of rows. For example, the vertical drive unit 12 drives each of the pixels 31 so that all the pixels 31 simultaneously perform global shutter operation of exposure. A pixel signal output from each of the pixels 31 in a row selectively scanned by the vertical drive unit 12 is supplied to the horizontal transfer unit 13 through each of the vertical signal lines 22.

The horizontal transfer unit 13 includes a signal processing unit 41 and a switch 42 for each column. The signal processing unit 41 performs, for example, analog/digital (A/D) conversion processing, correlated double sampling (CDS) processing, and the like for a pixel signal supplied via the vertical signal line 22. The pixel signals of columns, which have been subjected to signal processing, are sequentially supplied to the signal processing unit 14 by sequentially turning on the switch 42.

The signal processing unit 14 performs various pieces of signal processing such as addition processing on the pixel signal supplied from the horizontal transfer unit 13, and supplies the pixel signal after the signal processing to the output buffer 15.

Note that the sharing of the signal processing between the signal processing unit 41 of the horizontal transfer unit 13 and the signal processing unit 14 is not limited to the example, and can be changed.

The output buffer 15 controls the output of pixel signals.

Note that the CMOS image sensor 1 may be either of front-surface irradiated type or of back-surface irradiated type.

<Configuration Example of Pixel 31a>

Figure 2:
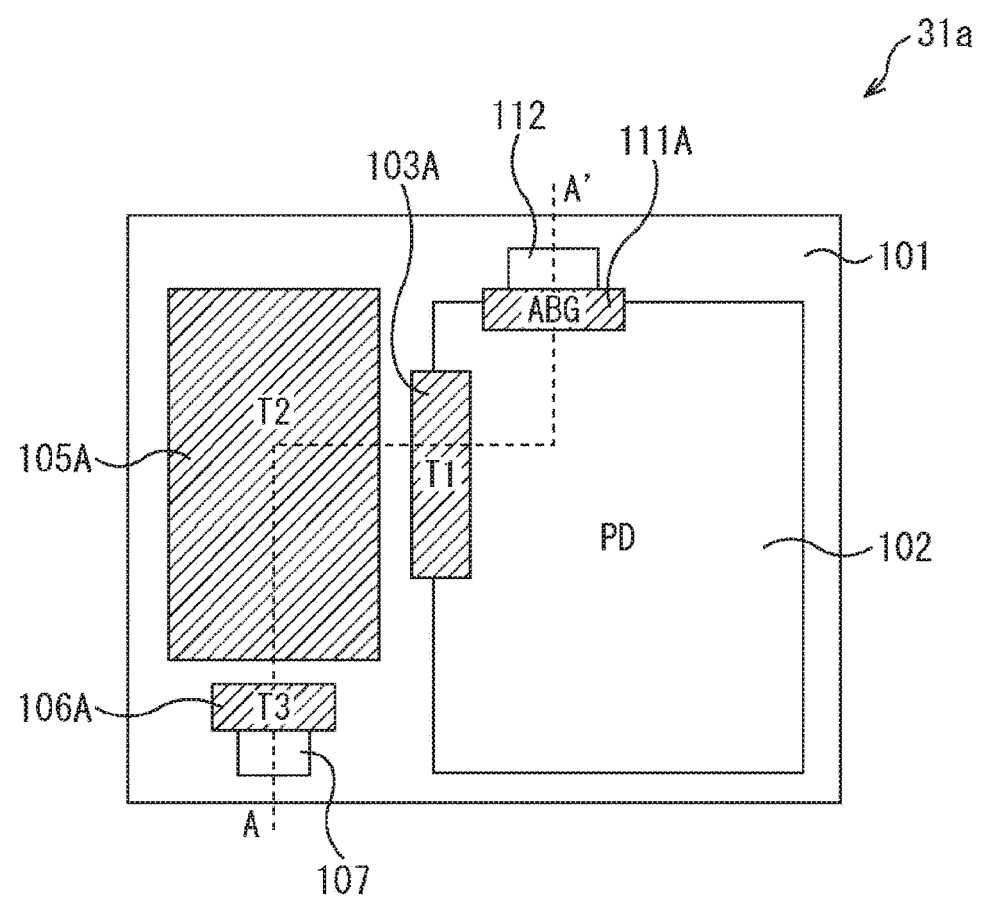
FIG. 2 is a plan view schematically illustrating a configuration example of a basic form of a unit pixel in FIG. 1.
Figure 3:
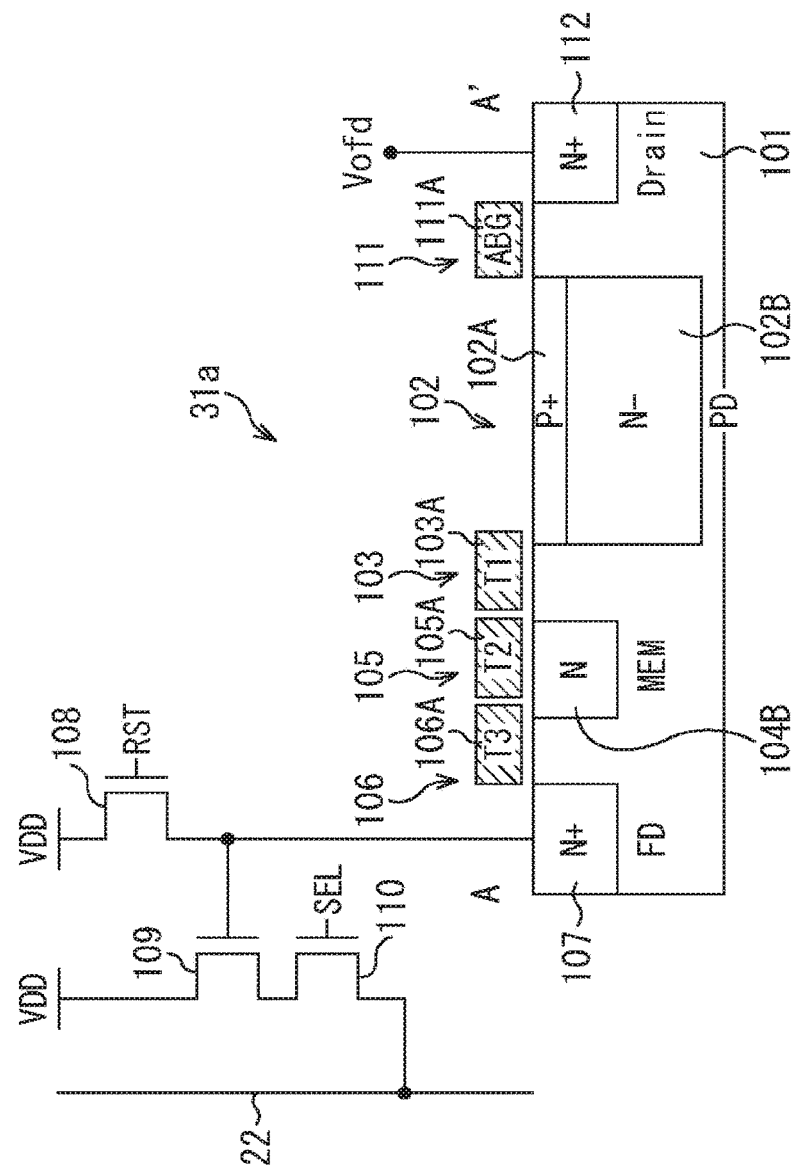
FIG. 3 is a cross-sectional view schematically illustrating a configuration example of the basic form of the unit pixel in FIG. 1.

FIGS. 2 and 3 illustrate a configuration example of a pixel 31a, which is a basic form of the pixel 31 of the pixel array unit 11 in FIG. 1. FIG. 2 is a schematic plan view of the pixel 31a. FIG. 3 schematically illustrates a configuration example of a cross section of the pixel 31a in an A-A' direction in FIG. 2. Although only one pixel 31a is illustrated in FIGS. 2 and 3, other pixels basically have a similar configuration.

Note that symbols "P" and "N" in the figures represent the polarities of semiconductor regions (P-type semiconductor region and N-type semiconductor region). Moreover, the tailing sign "+" or "−" of symbols "P+", "P−", "N+", and "N−" represents the impurity concentration of the P-type semiconductor region or the N-type semiconductor region. The sign "+" indicates high impurity concentration. The sign "−" indicates low impurity concentration. Furthermore, the impurity concentration of a semiconductor region to which neither "+" nor "−" is added is set between the impurity concentration of the semiconductor region to which "+" is added and that of the semiconductor region to which "−" is added. This also applies to the subsequent drawings.

Furthermore, in a case where the CMOS image sensor 1 is of front-surface irradiated type, the upper surface (front surface) of a semiconductor substrate 101 in FIG. 3 corresponds to a light incident surface. In contrast, in a case where the CMOS image sensor 1 is of back-surface irradiated type, the lower surface (back surface) of the semiconductor substrate 101 in FIG. 3 corresponds to the light incident surface.

Note that the surface, on which a gate electrode is provided, of the semiconductor substrate 101 will be hereinafter referred to as a circuit surface.

The pixel 31*a* includes the semiconductor substrate 101, a photodiode (PD) 102, a first transfer gate (T1) 103, a charge holding unit (MEM) 104, a second transfer gate (T2) 105, a third transfer gate (T3) 106, a floating diffusion (FD) 107, a reset transistor 108, an amplification transistor 109, a selection transistor 110, a charge drain gate (ABG) 111, and a charge drain unit (Drain) 112.

Note that FIGS. 2 and 3 illustrate an example in which N-channel MOS transistors are used for the reset transistor 108, the amplification transistor 109, and the selection transistor 110. Note, however, that the combination of the conductivity types of the reset transistor 108, the amplification transistor 109, and the selection transistor 110 is not limited to these combinations.

Furthermore, although not illustrated, the surfaces of the charge holding unit 104 and the FD 107 are shielded from light by a light shielding film of, for example, tungsten. Moreover, although not illustrated, an insulating film is formed between each gate electrode of the first transfer gate 103, the second transfer gate 105, the third transfer gate 106, and the charge drain gate 111 and the semiconductor substrate 101.

The photodiode 102 is an embedded-type photodiode formed by forming a P-type layer 102A on the surface of (a P-type well layer of) the semiconductor substrate 101 on the side of the circuit surface and embedding an N-type layer 102B below the P-type layer 102A. The P-type layer 102A and the N-type layer 102B have an impurity concentration that causes a depletion state at the time of draining charge.

The first transfer gate 103 transfers charge accumulated in the photodiode 102 by a control pulse T1 being applied to a gate electrode 103A.

Note that the state in which the control pulse T1 is applied to the gate electrode 103A will be hereinafter also referred to as a state in which the first transfer gate 103 is turned on. Furthermore, the state in which the control pulse T1 is not applied to the gate electrode 103A will be hereinafter also referred to as a state in which the first transfer gate 103 is turned off.

The charge holding unit 104 is formed below a gate electrode 105A of the second transfer gate 105 by an N-type embedded channel having an impurity concentration that causes a depletion state at the time of draining charge. The charge holding unit 104 holds the charge transferred from the photodiode 102 by the first transfer gate 103.

The second transfer gate 105 modulates the charge holding unit 104 by a control pulse T2 being applied to the gate electrode 105A. That is, the potential of the charge holding unit 104 is deepened by the control pulse T2 being applied to the gate electrode 105A. This causes a saturation charge amount of the charge holding unit 104 to be increased compared to the case where the charge holding unit 104 is not modulated.

Note that the state in which the control pulse T2 is applied to the gate electrode 105A will be hereinafter also referred to as a state in which the second transfer gate 105 is turned on. Furthermore, the state in which the control pulse T2 is not applied to the gate electrode 105A will be hereinafter also referred to as a state in which the second transfer gate 105 is turned off.

The third transfer gate 106 transfers charge accumulated in the charge holding unit 104 by a control pulse T3 being applied to a gate electrode 106A.

Note that the state in which the control pulse T3 is applied to the gate electrode 106A will be hereinafter also referred to as a state in which the third transfer gate 106 is turned on. Furthermore, the state in which the control pulse T3 is not applied to the gate electrode 106A will be hereinafter also referred to as a state in which the third transfer gate 106 is turned off.

The FD 107 is a charge-voltage conversion unit including an N-type layer having an impurity concentration at which a contact for wiring can be connected. The FD 107 holds charge transferred from the charge holding unit 104 by the third transfer gate 106, and converts the charge into voltage.

A drain electrode of the reset transistor 108 is connected to a power source VDD, and a source electrode is connected to the FD 107. Charge is drained from the FD 107 and the FD 107 is reset by a reset pulse RST being added to a gate electrode of the reset transistor 108 and the reset transistor 108 being turned on.

A drain electrode of the amplification transistor 109 is connected to the power source VDD, and a gate electrode is connected to the FD 107. A drain electrode of the selection transistor 110 is connected to a source electrode of the amplification transistor 109, and the source electrode is connected to the vertical signal line 22. Then, the pixel 31*a* is selected by a selection pulse SEL being added to a gate electrode of the selection transistor 110 and the selection transistor 110 being turned on. For the pixel 31*a*, a pixel signal is to be read. That is, in a case where the selection transistor 110 is turned on, the amplification transistor 109 supplies a pixel signal indicating the voltage of the FD 107 to the horizontal transfer unit 13 via the vertical signal line 22.

Note that the selection transistor 110 can connect the power source VDD and the drain electrode of the amplification transistor 109. Furthermore, one or a plurality of the reset transistor 108, the amplification transistor 109, and the selection transistor 110 can be omitted depending on a method of reading a pixel signal, or shared between multiple pixels.

The charge drain gate 111 transfers charge accumulated in the photodiode 102 by a control pulse ABG being applied to a gate electrode 111A.

Note that the state in which the control pulse ABG is applied to the gate electrode 111A will be hereinafter also referred to as a state in which the charge drain gate 111 is turned on. Furthermore, the state in which the control pulse ABG is not applied to the gate electrode 111A will be hereinafter also referred to as a state in which the charge drain gate 111 is turned off.

The charge drain unit 112 includes an N-type layer having an impurity concentration at which a contact for wiring can be connected. The charge drain unit 112 is connected to a power source Vofd, and the potential of the charge drain unit 112 is substantially equal to that of the power source Vofd. Charge that has been transferred from the photodiode 102 to the charge drain unit 112 by the charge drain gate 111 is drained to the power source Vofd.

Then, the vertical drive unit 12 drives each of the pixels 31a so that all the pixels 31a simultaneously perform electronic shutter operation. The electronic shutter operation is an operation in which charge accumulation into the photodiode 102 is started after resetting the photodiode 102 and the charge accumulated in the photodiode 102 is transferred to the charge holding unit 104 after a predetermined period of time. Furthermore, the vertical drive unit 12 drives each of the pixels 31a so that reading of charge from the charge holding unit 104 to the FD 107 and output of a pixel signal from each of the pixels 31a to the vertical signal line 22 are performed for each pixel row.

Deviation of exposure period of time between pixels 31a and distortion of a captured image are inhibited by all the pixels 31a simultaneously performing the electronic shutter operation.

In contrast, in the CMOS image sensor 1 using the pixel 31a, the number of components (e.g., charge holding unit 104, second transfer gate 105, and third transfer gate 106) inside the pixel 31a is increased. Therefore, the light receiving area and volume of the photodiode 102 are reduced.

Furthermore, the photodiode 102 and the charge holding unit 104 cannot increase accumulated charge density per unit area for the following reason.

Figure 4:
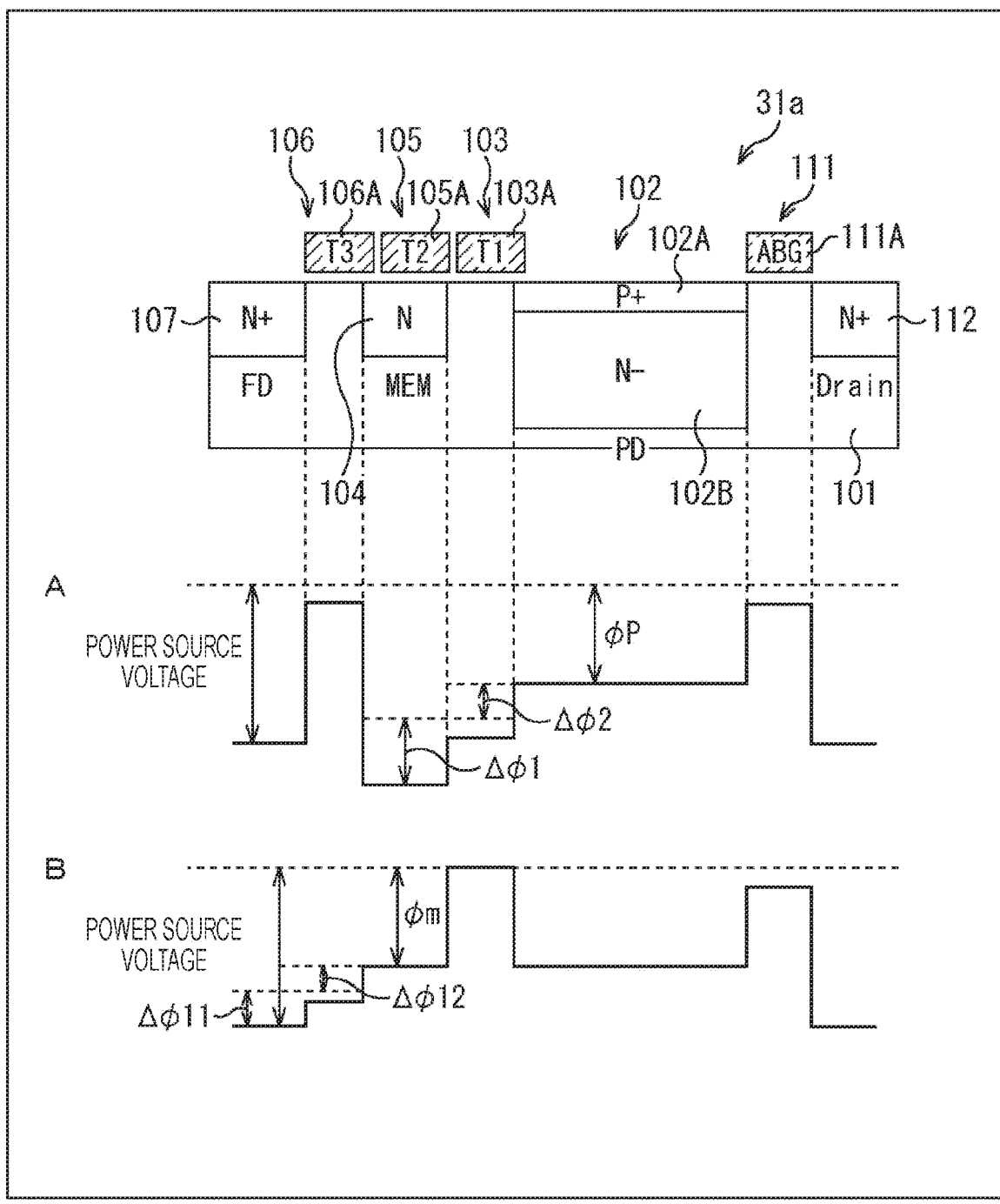
FIG. 4 is a potential diagram of the unit pixel in FIG. 3.

FIGS. A and B of FIG. 4 are potential diagrams in the A-A' direction at the time of transferring charge of the pixel 31a in FIG. 2. In the potential diagram, the vertical direction indicates potential, and the potential increases toward the downward direction.

Note that lowering (rise of potential barrier in the upward direction in the figure) of potential of a potential barrier between elements (e.g., photodiode 102 and charge holding unit 104) will be hereinafter referred to as heightening or rise of the potential barrier. In contrast, heightening (lowering of the potential barrier in the downward direction in the figure) of potential of a potential barrier between elements will be referred to as lowering or falling of the potential barrier.

A figure A of FIG. 4 is a potential diagram at the time of transferring charge from the photodiode 102 to the charge holding unit 104. At this time, the first transfer gate 103 and the second transfer gate 105 are turned on, and the third transfer gate 106 and the charge drain gate 111 are turned off. This lowers a potential barrier (hereinafter, referred to as a potential barrier T1) between the photodiode 102 and the charge holding unit 104, and deepens the potential of the charge holding unit 104.

Note that $\varphi p$ in the figure indicates the depth of the potential of the photodiode 102 in the depletion state. $\Delta\varphi 1$ indicates an amount of change in the potential of the charge holding unit 104 due to charge that has been transferred from the photodiode 102. $\Delta\varphi 2$ indicates the potential difference between the photodiode 102 and the charge holding unit 104.

Here, in order to enable charge to be completely transferred at the time of saturation of the photodiode 102, the potential difference $\Delta\varphi 2$ at the time of saturation of the photodiode 102 needs to be set to a predetermined value or more. Consequently, the potential (hereinafter, referred to as depletion potential) in the depletion state of the photodiode 102 needs to be set sufficiently lower than the power source voltage VDD. Therefore, the accumulated charge density per unit volume of the photodiode 102 cannot be increased very much.

The figure B of FIG. 4 is a potential diagram at the time of transferring charge from the charge holding unit 104 to the FD 107. At this time, the third transfer gate 106 is turned on, and the first transfer gate 103, the second transfer gate 105, and the charge drain gate 111 are turned off. This lowers a potential barrier (hereinafter, referred to as a potential barrier T3) between the charge holding unit 104 and the FD 107.

Note that $\varphi m$ in the figure indicates the depth of the potential of the charge holding unit 104 in the depletion state. $\Delta\varphi 11$ indicates an amount of change in the potential of the FD 107 due to charge that has been transferred from the charge holding unit 104. $\Delta\varphi 12$ indicates the potential difference between the charge holding unit 104 and the FD 107.

Here, in order to enable charge to be completely transferred at the time of saturation of the charge holding unit 104, the potential difference $\Delta\varphi 12$ at the time of saturation of the charge holding unit 104 needs to be set to a predetermined value or more. Consequently, the depletion potential of the charge holding unit 104 needs to be set sufficiently lower than the power source voltage VDD. Therefore, the accumulated charge density per unit volume of the charge holding unit 104 cannot be increased very much.

Figure 5:
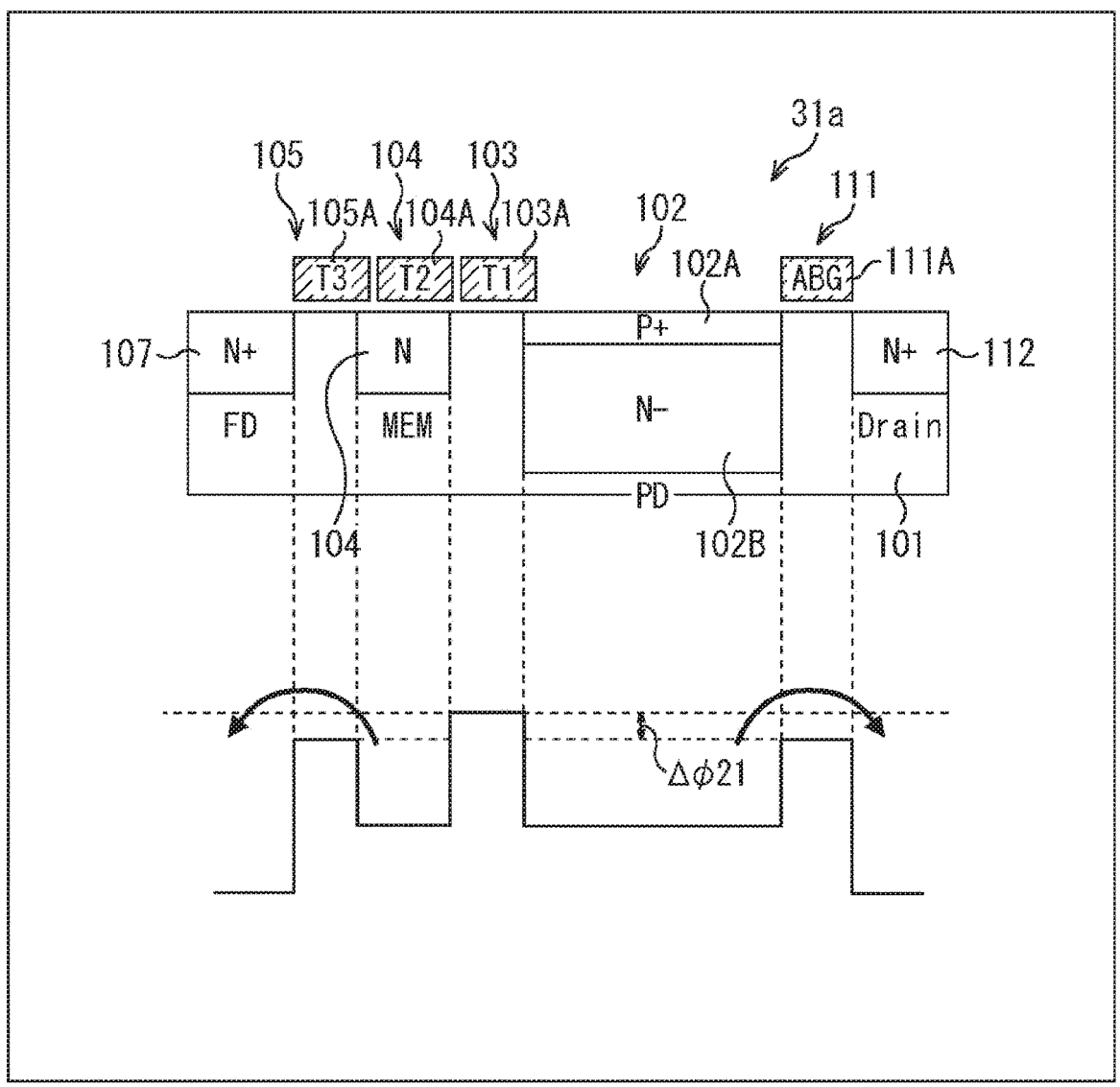
FIG. 5 is a potential diagram of the unit pixel in FIG. 3.

FIG. 5 is a potential diagram in the A-A' direction during the exposure period of time of the pixel 31a in FIG. 2 (during accumulation of charge into the photodiode 102). In the potential diagram, the vertical direction indicates potential, and the potential increases toward the downward direction.

At this time, the first transfer gate 103, the second transfer gate 105, the third transfer gate 106, and the charge drain gate 111 are turned off.

Furthermore, at this time, charges of different frames are accumulated in the photodiode 102 and the charge holding unit 104. Therefore, if interference occurs between the photodiode 102 and the charge holding unit 104, image quality is significantly deteriorated.

In contrast, a potential barrier (hereinafter, referred to as a potential barrier ABG) between the photodiode 102 and the charge drain unit 112 is set $\Delta\varphi 21$ lower than the potential barrier T1 between the photodiode 102 and the charge holding unit 104 so that, even if the photodiode 102 is saturated and charges overflows, the overflowing charges flow not into the charge holding unit 104 but into the charge drain unit 112. In this way, the saturation charge amount of the photodiode 102 is decreased by setting the potential barrier ABG low.

Furthermore, the potential barrier T3 between the charge holding unit 104 and the FD 107 is set $\Delta\varphi 21$ lower than the potential barrier T1 between the photodiode 102 and the charge holding unit 104 so that, even if the charge holding unit 104 is saturated and charges overflows, the overflowing charges flow not into the photodiode 102 but into the FD 107. In this way, the saturation charge amount of the charge holding unit 104 is decreased by setting the potential barrier T3 low.

As described above, in the pixel 31a, the light receiving area, volume, saturation charge amount, and accumulated charge density per unit volume of the photodiode 102 are decreased. Furthermore, the saturation charge amount and accumulated charge density per unit volume of the charge holding unit 104 are decreased. As a result, the sensitivity and dynamic range of the CMOS image sensor 1 are lowered.

In contrast, in order to prevent lowering of the sensitivity and dynamic range of the CMOS image sensor 1, the photodiode 102 and the charge holding unit 104 need to be expanded. Thus, the size of the CMOS image sensor 1 is increased.

2. First Embodiment

Next, a first embodiment of the present technology will be described with reference to FIGS. 6 to 15.

<Configuration Example of Pixel 31b>

Figure 6:
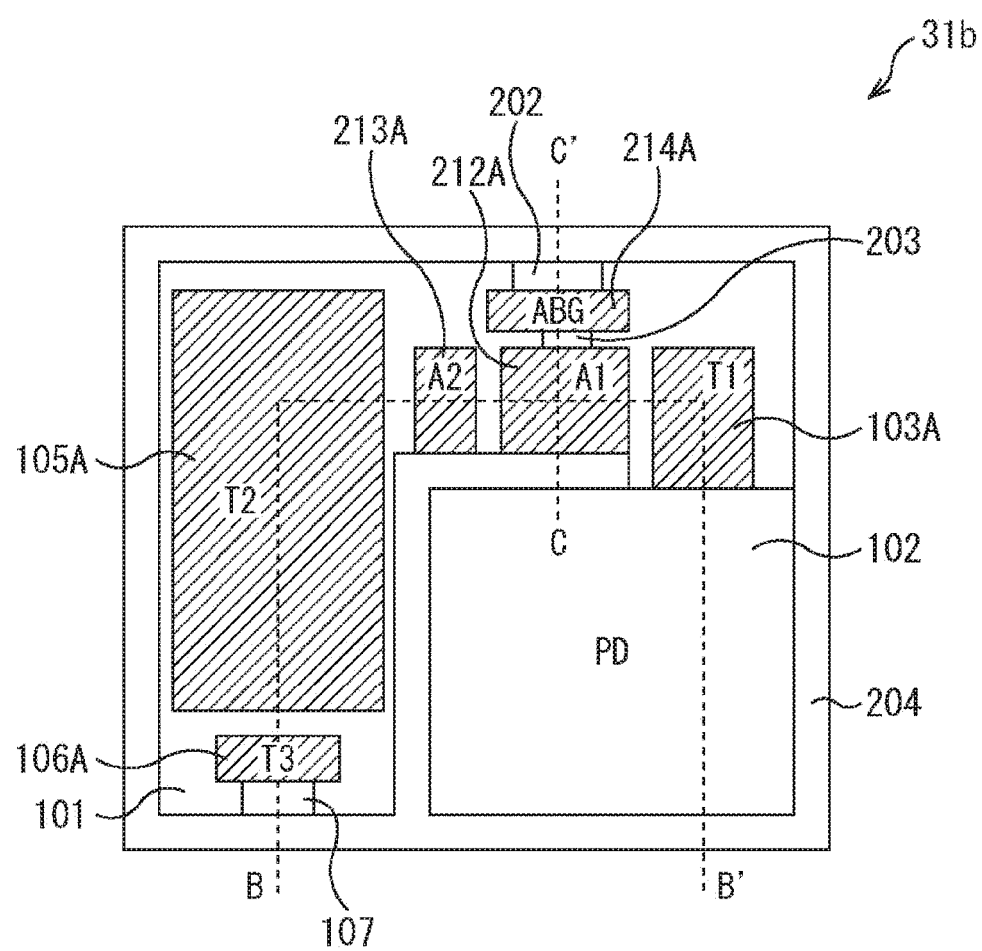
FIG. 6 is a plan view schematically illustrating a configuration example of a first embodiment of the unit pixel in FIG. 1.
Figure 7:
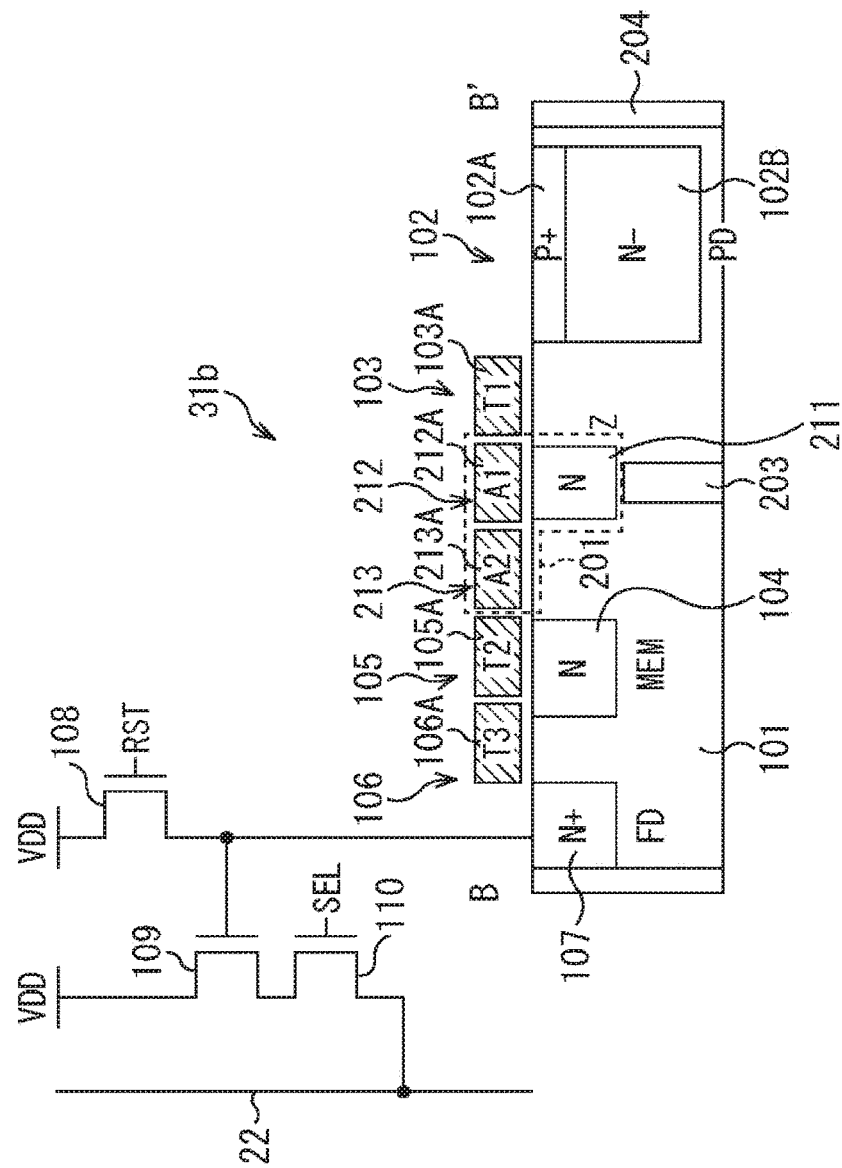
FIG. 7 is a cross-sectional view schematically illustrating a configuration example of the first embodiment of the unit pixel in FIG. 1.
Figure 8:
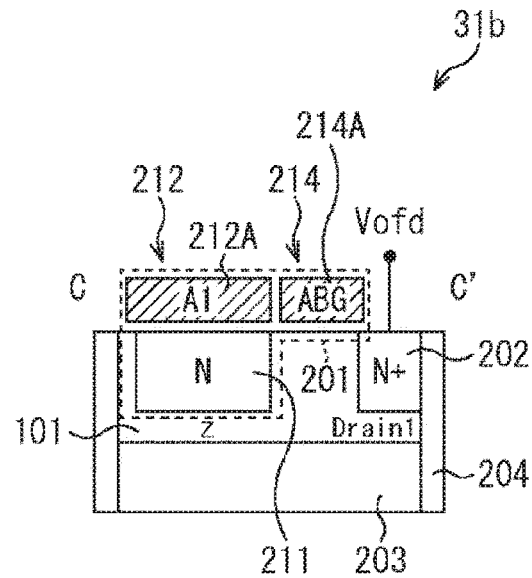
FIG. 8 is a cross-sectional view schematically illustrating a configuration example of the first embodiment of the unit pixel in FIG. 1.

FIGS. 6 to 8 illustrate a configuration example of a pixel 31b, which is the first embodiment of the pixel 31 of the pixel array unit 11 in FIG. 1. FIG. 6 is a schematic plan view of the pixel 31b. FIG. 7 schematically illustrates a configuration example of a cross section of the pixel 31b in a B-B' direction in FIG. 6. FIG. 8 schematically illustrates a configuration example of a cross section of the pixel 31b in a C-C' direction in FIG. 6. Although only one pixel 31b is illustrated in FIGS. 6 to 8, other pixels basically have a similar configuration.

Note that, in the figures, the same sign is attached to a part corresponding to the pixel 31a in FIGS. 2 and 3, and the description thereof will be appropriately omitted.

The pixel 31b is different from the pixel 31a in that a charge transfer unit 201, a charge drain unit (Drain1) 202, a separation unit 203, and a deep trench isolation (DTI) 204 are added and the charge drain gate 111 and the charge drain unit 112 are deleted.

The charge transfer unit 201 transfers charge in two directions of a direction of the charge holding unit 104 and a direction of the charge drain unit 202. For example, the charge transfer unit 201 transfers charge that has been transferred from the photodiode 102 by the first transfer gate 103 in a direction of the charge holding unit 104 or direction of the charge drain unit 202. Furthermore, for example, the charge transfer unit 201 transfers charge overflowing from the photodiode 102 and the charge holding unit 104 and flowing thereinto in the direction of the charge drain unit 202.

Note that, in the specification, the charge transfer direction is not necessarily limited to a linear direction, and may be, for example, curved or bent.

The charge transfer unit 201 includes a transfer region (Z) 211, a fourth transfer gate (A1) 212, a fifth transfer gate (A2) 213, and a charge drain gate (ABG) 214.

The transfer region 211 is a transfer channel region formed by an N-type embedded channel below a gate electrode 212A of the fourth transfer gate 212. The N-type embedded channel has the same polarity as the N-type layer 102B, which is a region for holding charge of the photodiode 102. The transfer region 211 is a region into which charge that has been transferred from the photodiode 102 by the first transfer gate 103 and charge overflowing from the photodiode 102 and the charge holding unit 104 flow.

The fourth transfer gate 212 modulates the transfer region 211 by a control pulse A1 being applied to the gate electrode 212A. That is, the potential of the transfer region 211 is deepened by the control pulse A1 being applied to the gate electrode 212A.

Note that the state in which the control pulse A1 is applied to the gate electrode 212A will be hereinafter also referred to as a state in which the fourth transfer gate 212 is turned on. Furthermore, the state in which the control pulse A1 is not applied to the gate electrode 212A will be hereinafter also referred to as a state in which the fourth transfer gate 212 is turned off.

The fifth transfer gate 213 transfers charge that has flowed into the transfer region 211 by a control pulse A2 being applied to a gate electrode 213A.

Note that the state in which the control pulse A2 is applied to the gate electrode 213A will be hereinafter also referred to as a state in which the fifth transfer gate 213 is turned on. Furthermore, the state in which the control pulse A2 is not applied to the gate electrode 213A will be hereinafter also referred to as a state in which the fifth transfer gate 213 is turned off.

The charge drain gate 214 transfers charge that has flowed into the transfer region 211 by a control pulse ABG being applied to a gate electrode 214A.

Note that the state in which the control pulse ABG is applied to the gate electrode 214A will be hereinafter also referred to as a state in which the charge drain gate 214 is turned on. Furthermore, the state in which the control pulse ABG is not applied to the gate electrode 214A will be hereinafter also referred to as a state in which the charge drain gate 214 is turned off.

The charge drain unit 202 includes an N-type layer having an impurity concentration at which a contact for wiring can be connected. The charge drain unit 202 is connected to a power source Vofd, and the potential of the charge drain unit 202 is substantially equal to that of the power source Vofd. Then, charge that has been transferred from the photodiode 102 to the charge drain unit 202 by the charge drain gate 214 is drained to the power source Vofd.

The separation unit 203 is disposed below the transfer region 211, and electrically separates the photodiode 102 and the charge holding unit 104 and the FD 107. The separation unit 203 includes, for example, a physical barrier or a drain. The physical barrier includes, for example, a sufficiently deep trench, a DTI that penetrates to the lower surface opposite to the circuit surface of the semiconductor substrate 101, and the like. The drain traps charge. The separation unit 203 inhibits charge from passing and blooming below the transfer region 211.

Note that, in a case where the separation unit 203 is implemented by a physical barrier, the separation unit 203 is formed more easily in the case where the CMOS image sensor 1 is of back-surface irradiated type.

The DTI 204 surrounds the pixel 31b, and electrically separates adjacent pixels 31b. Furthermore, the DTI 204 electrically separates the photodiode 102 and the gate electrode 105A, the gate electrode 106A, the gate electrode 212A, and the gate electrode 213A.

Next, the operation of the pixel 31b will be described with reference to FIGS. 9 and 15.

Figure 9:
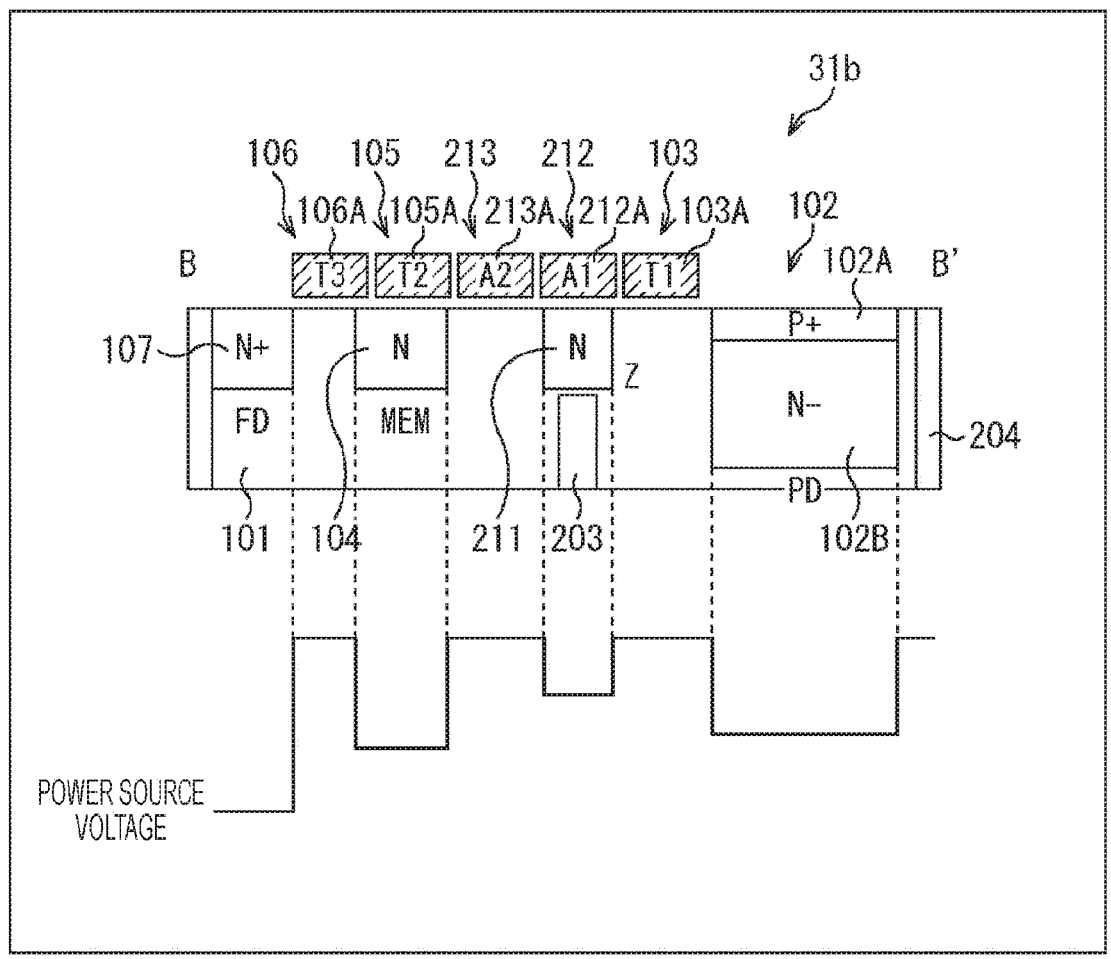
FIG. 9 is a potential diagram of the unit pixel in FIG. 7.
Figure 10:
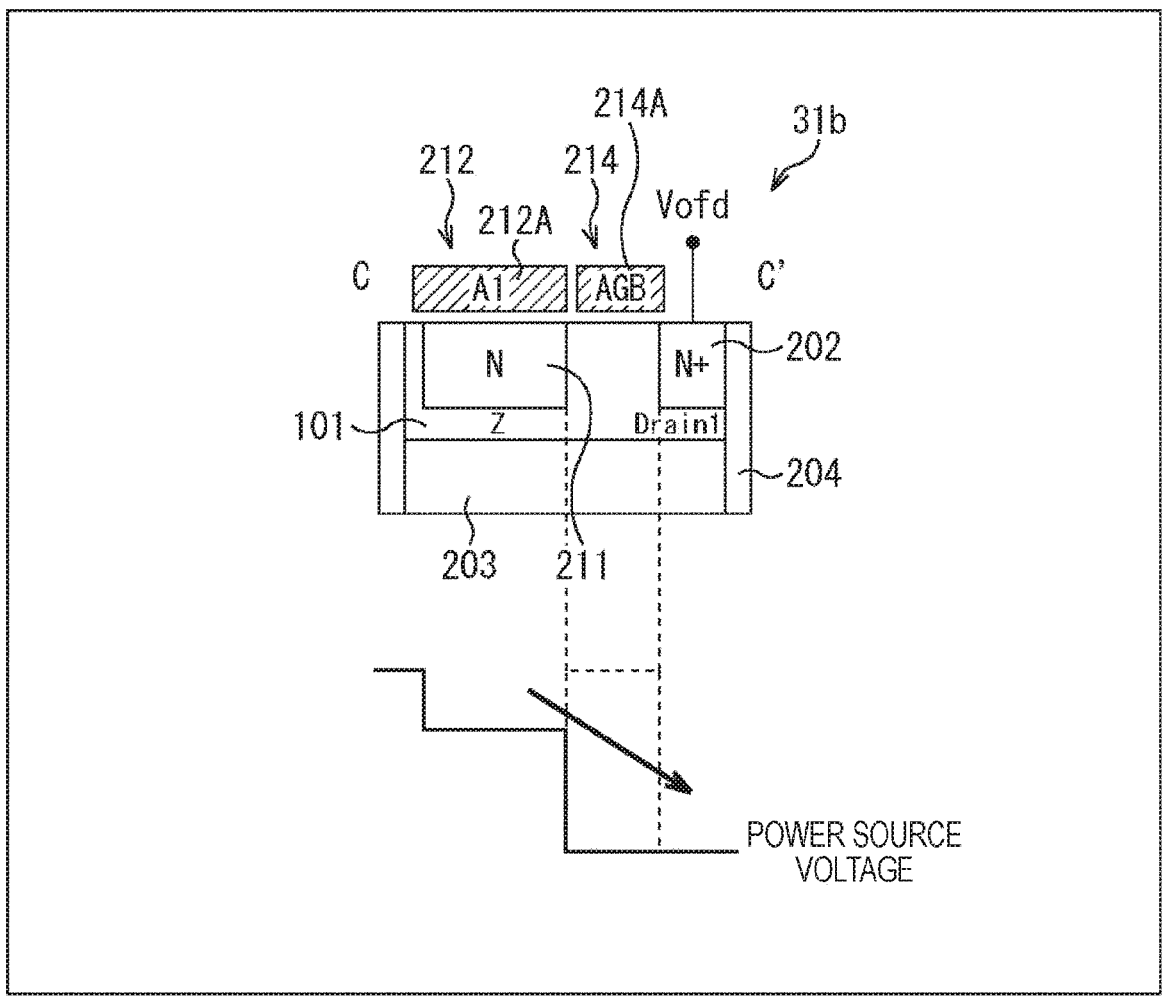
FIG. 10 is a potential diagram of the unit pixel in FIG. 8.
Figure 12:
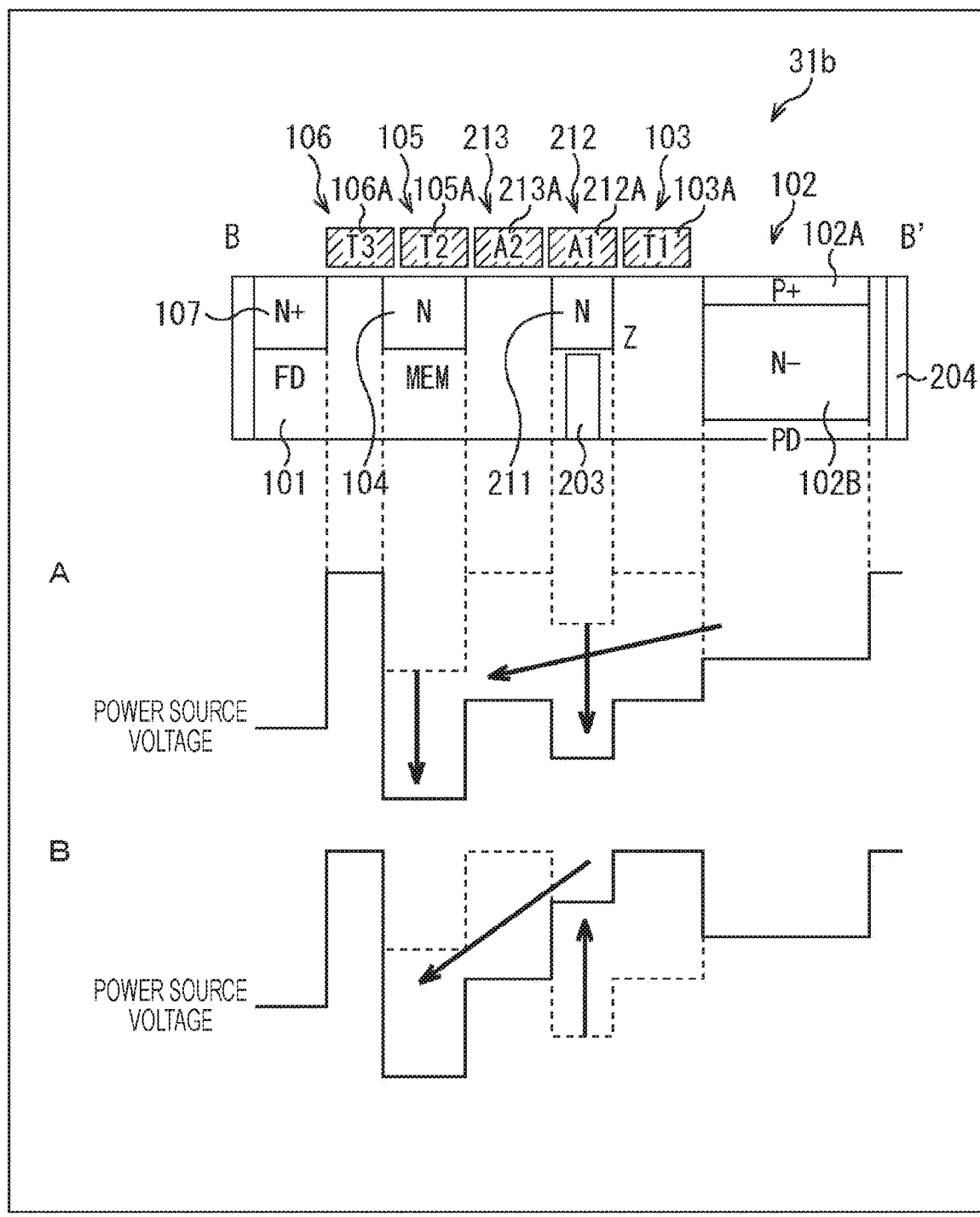
FIG. 12 is a potential diagram of the unit pixel in FIG. 7.
Figure 13:
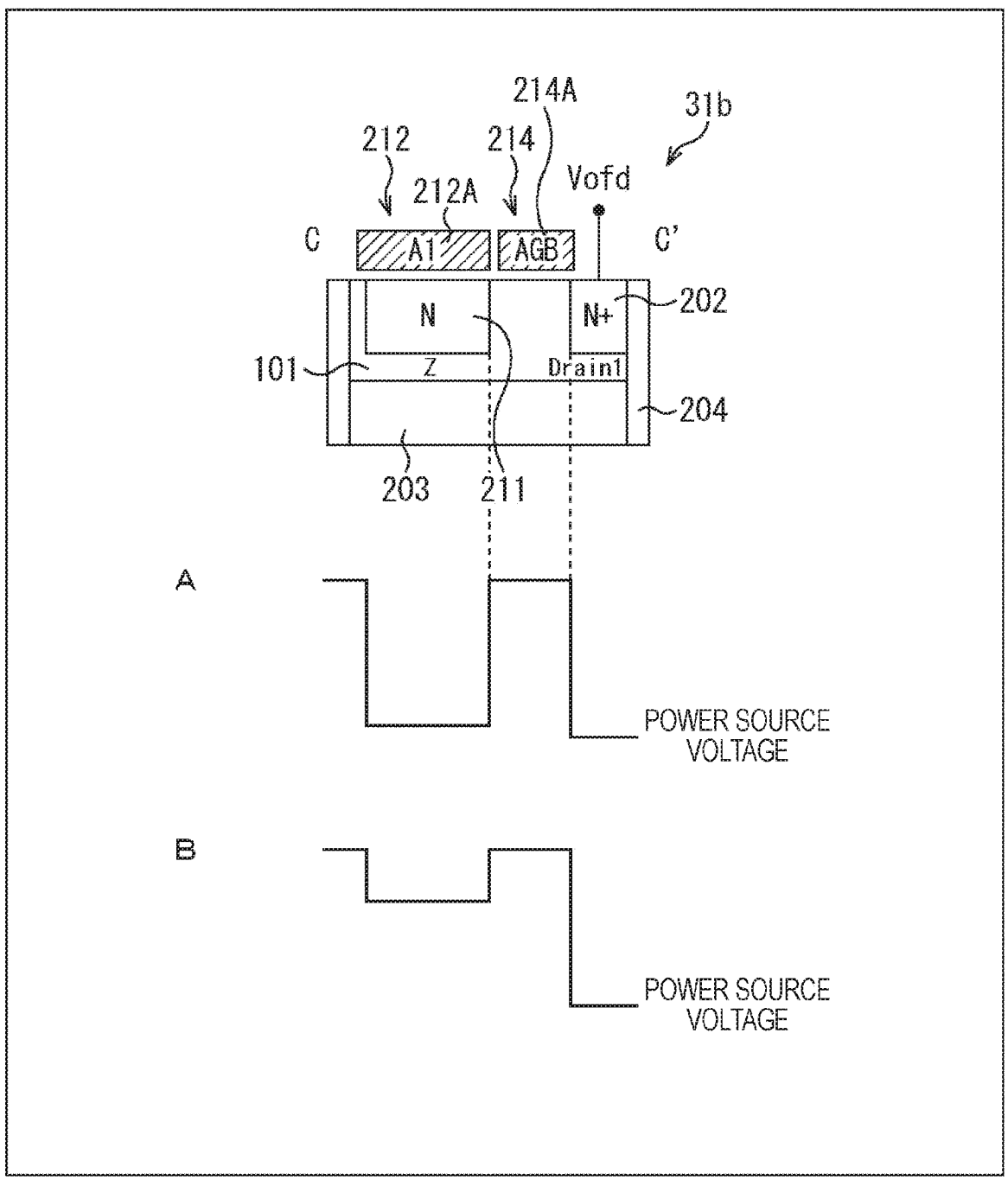
FIG. 13 is a potential diagram of the unit pixel in FIG. 8.
Figure 14:
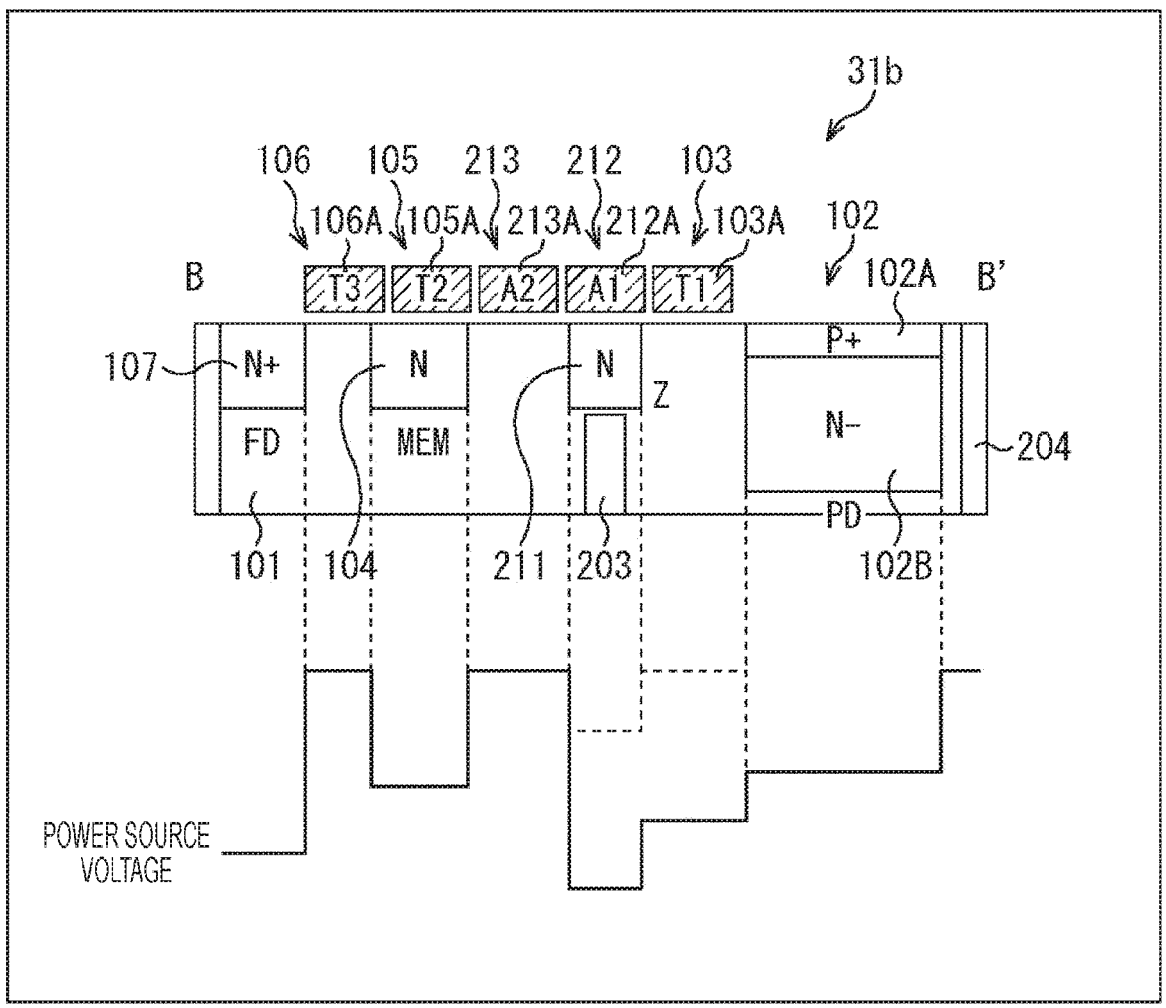
FIG. 14 is a potential diagram of the unit pixel in FIG. 7.

The lower figures of FIGS. 9, 12, and 14 are potential diagrams of the pixel 31b in FIG. 6 in the B-B' direction. The lower figures of FIGS. 10, 13, and 15 are potential diagrams of the pixel 31b in FIG. 6 in the C-C' direction. In these potential diagrams, the vertical direction indicates potential, and the potential increases toward the downward direction.

FIGS. 9 and 10 illustrate the state of the pixel 31b during an exposure period of time (during accumulation of charge into the photodiode 102).

Specifically, the first transfer gate 103 to the fifth transfer gate 213 are turned off, and the charge drain gate 214 is turned on. As a result, the potential barrier T1 between the photodiode 102 and the transfer region 211 is higher than the depletion potential of the photodiode 102 and the depletion potential of the transfer region 211.

This causes the charge that has been generated by photoelectric conversion to be stored in the photodiode 102 with no change.

Furthermore, a potential barrier (hereinafter, referred to as a potential barrier A2) between the transfer region 211 and the charge holding unit 104 is higher than the depletion potential of the transfer region 211 and the depletion potential of the charge holding unit 104. A potential barrier (hereinafter, referred to as a potential barrier ABG) between the transfer region 211 and the charge drain unit 202 is lower than the depletion potential of the transfer region 211, and substantially equal to the power source voltage Vofd.

Figure 11:
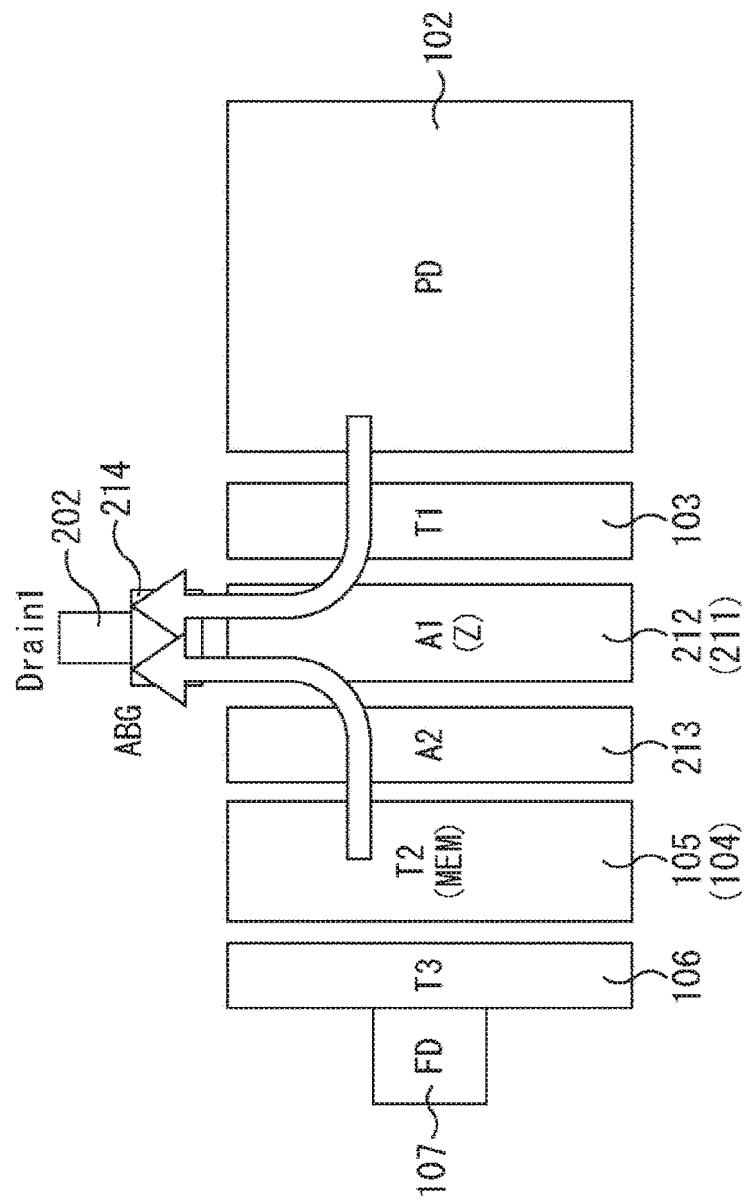
FIG. 11 illustrates a flow of charge overflowing from a photodiode and a charge holding unit.

This causes charge overflowed by saturation of the photodiode 102 and charge overflowed by saturation of the charge holding unit 104 to flow into the transfer region 211 as illustrated in FIG. 11. The charge that has flowed into the transfer region 211 is drained to the charge drain unit 202 via the charge drain gate 214. As a result, interference between the photodiode 102 and the charge holding unit 104 is prevented.

Furthermore, the potential barrier T3 between the charge holding unit 104 and the FD 107 becomes higher than the depletion potential of the charge holding unit 104 and the power source voltage VDD.

FIGS. 12 and 13 illustrate the state of the pixel 31b at the time of transferring charge from the photodiode 102 to the charge holding unit 104.

First, as illustrated in A of FIG. 12 and A of FIG. 13, the first transfer gate 103, the second transfer gate 105, the fourth transfer gate 212, and the fifth transfer gate 213 are turned on, and the third transfer gate 106 and the charge drain gate 214 are turned off. As a result, the potential barrier T1 and the potential barrier A2 become lower than the depletion potential of the photodiode 102, and become higher than the depletion potential of the transfer region 211 and the depletion potential of the charge holding unit 104. The potential barrier ABG becomes higher than the depletion potential of the transfer region 211.

This causes charge accumulated in the photodiode 102 to be transferred to the charge holding unit 104 via the first transfer gate 103, the transfer region 211, and the fifth transfer gate 213.

Next, as illustrated in B of FIG. 12 and B of FIG. 13, the first transfer gate 103 and the fourth transfer gate 212 are turned on. As a result, the potential barrier T1 becomes higher than the depletion potential of the photodiode 102 and the depletion potential of the transfer region 211. The potential barrier A2 becomes lower than the depletion potential of the transfer region 211.

This stops the transfer of the charge from the photodiode 102. In contrast, the charge remaining in the transfer region 211 is transferred to the charge holding unit 104 via the fifth transfer gate 213.

In this way, the charge accumulated in the photodiode 102 is transferred to the charge holding unit 104.

Figure 15:
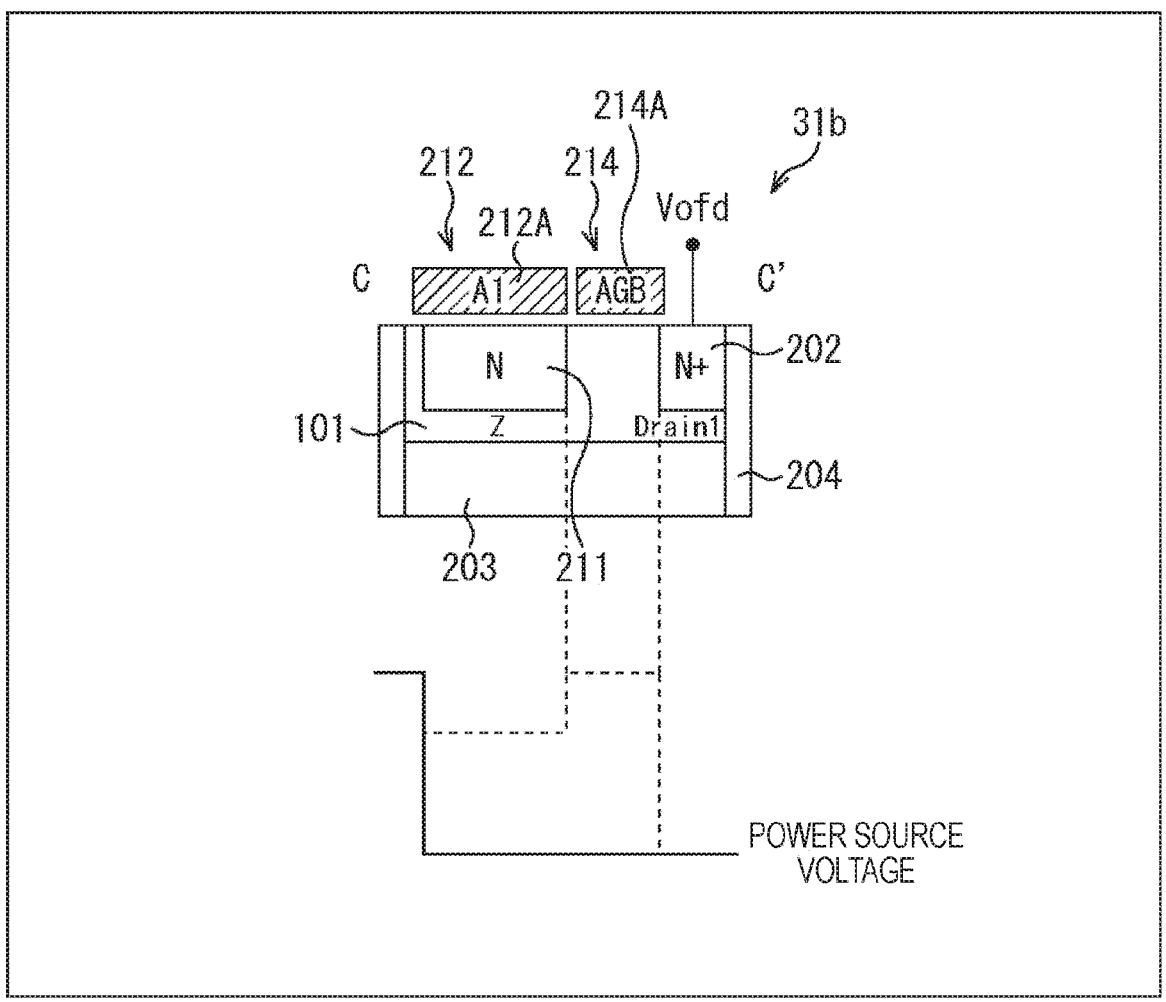
FIG. 15 is a potential diagram of the unit pixel in FIG. 8.

FIGS. 14 and 15 illustrate the state of the pixel 31b at the time of resetting the photodiode 102.

In this case, the first transfer gate 103, the fourth transfer gate 212, and the charge drain gate 214 are turned on, and the second transfer gate 105, the third transfer gate 106, and the fifth transfer gate 213 are turned off. As a result, the potential barrier T1 becomes lower than the depletion potential of the photodiode 102, and becomes higher than the depletion potential of the transfer region 211. The potential barrier ABG becomes substantially equal to the depletion potential of the transfer region 211 and the power source voltage Vofd.

This causes charge accumulated in the photodiode 102 to be transferred to the transfer region 211 via the first transfer gate 103. The charge that has been transferred to the transfer region 211 is drained to the charge drain unit 202 via the charge drain gate 214. In this way, the photodiode 102 is reset.

As described above, interference between the photodiode 102 and the charge holding unit 104 is prevented in the pixel 31b.

Furthermore, only one first transfer gate 103 is provided as a transfer gate to the photodiode 102, and only one direction is provided as a transfer direction of charge from the photodiode 102. Consequently, the pixel 31b can be designed more easily than the pixel 31a in which two directions are provided as transfer directions of charge from the photodiode 102. Furthermore, unlike the pixel 31a in FIG. 5, the potential barrier ABG lower than the potential barrier T1 does not need to be provided in the photodiode 102, so that the saturation charge amount of the photodiode 102 can be increased.

Furthermore, unlike the pixel 31a in FIG. 5, the potential barrier T3 between the charge holding unit 104 and the FD 107 does not need to be lower than the potential barrier A2 between the charge holding unit 104 and the transfer region 211. Therefore, the saturation charge amount of the charge holding unit 104 can be increased.

Furthermore, since the transfer region 211 does not need to hold charge, the area can be reduced. Consequently, although the transfer region 211 has two charge transfer directions, the transfer region 211 can be easily designed.

3. Second Embodiment

Next, a second embodiment of the present technology will be described with reference to FIGS. 16 to 18.

<Configuration Example of Pixel 31c>

Figure 16:
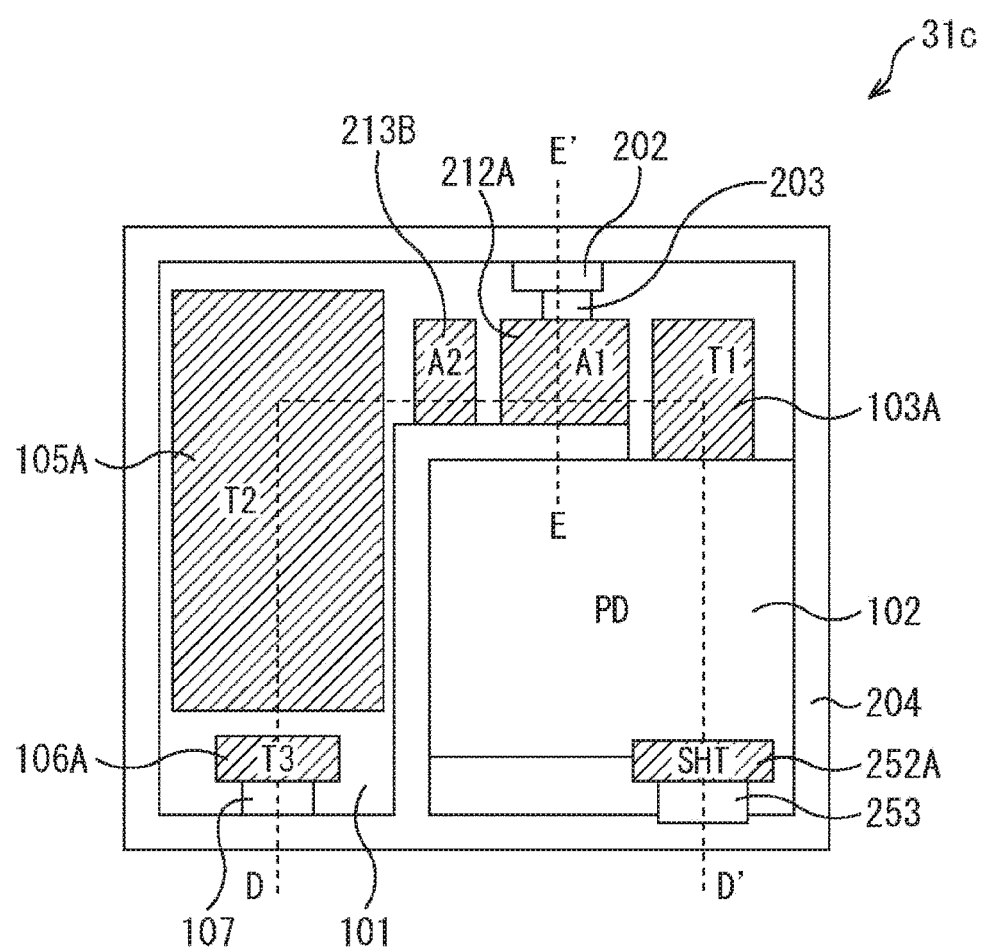
FIG. 16 is a plan view schematically illustrating a configuration example of a second embodiment of the unit pixel in FIG. 1.
Figure 17:
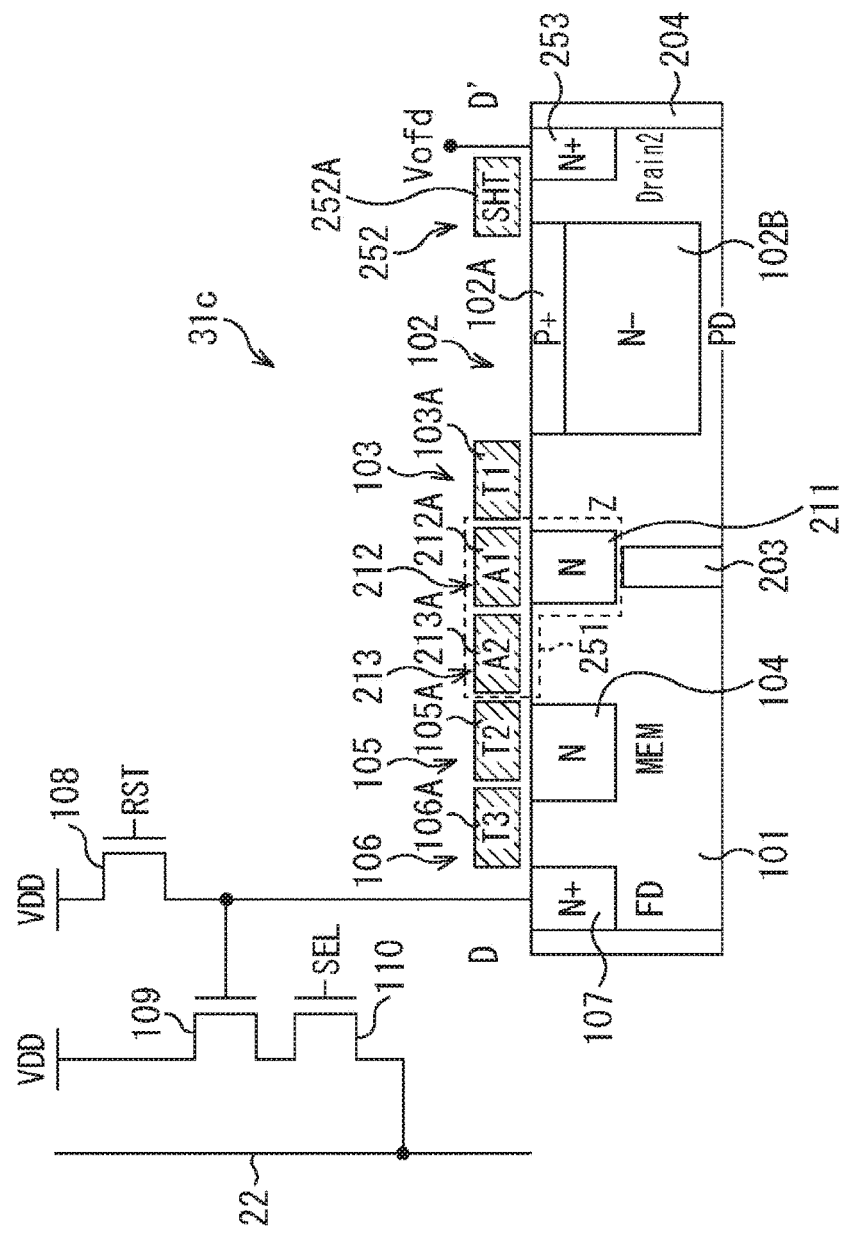
FIG. 17 is a cross-sectional view schematically illustrating a configuration example of the second embodiment of the unit pixel in FIG. 1.
Figure 18:
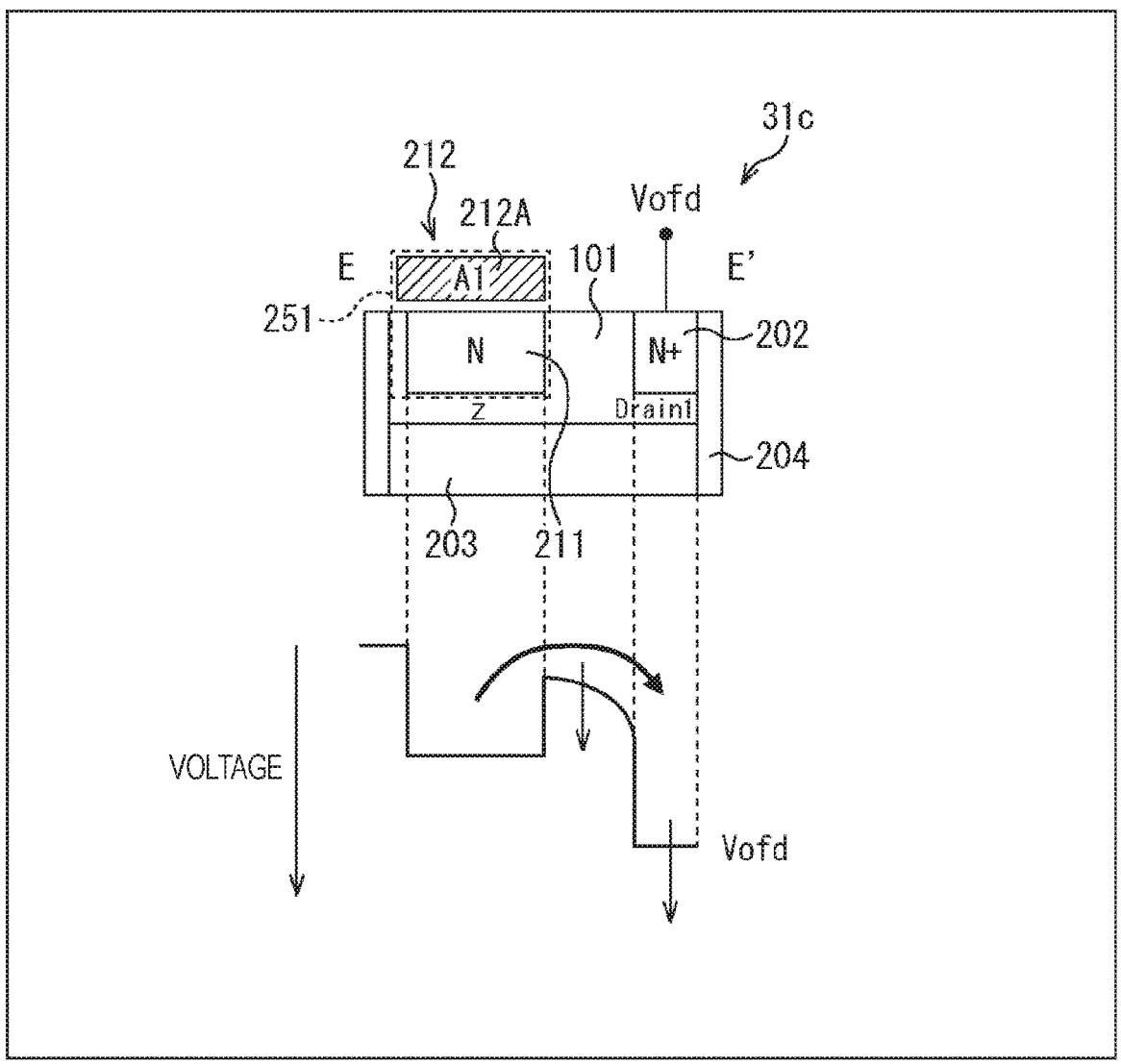
FIG. 18 is a cross-sectional view schematically illustrating a configuration example of the second embodiment of the unit pixel in FIG. 1.

FIGS. 16 to 18 illustrate a configuration example of a pixel 31c, which is the second embodiment of the pixel 31 of the pixel array unit 11 in FIG. 1. FIG. 16 is a schematic plan view of the pixel 31c. FIG. 17 schematically illustrates a configuration example of a cross section of the pixel 31c in a D-D' direction in FIG. 16. FIG. 18 schematically illustrates a configuration example of a cross section of the pixel 31c in an E-E' direction in FIG. 16. Although only one pixel 31c is illustrated in FIGS. 16 to 18, other pixels basically have a similar configuration.

Note that, in the figures, the same sign is attached to a part corresponding to the pixel 31b in FIGS. 6 and 8, and the description thereof will be appropriately omitted.

The pixel 31c is different from the pixel 31b in that a charge transfer unit 251 is provided instead of the charge transfer unit 201 and a shutter gate (SHT) 252 and a second charge drain unit (Drain2) 253 are added.

The charge transfer unit 251 is different from the charge transfer unit 201 in that the charge drain gate 214 is deleted.

Note that, in a case where the charge drain unit 202 is distinguished from the second charge drain unit 253, the charge drain unit 202 will be hereinafter referred to as a first charge drain unit 202.

The shutter gate 252 transfers charge accumulated in the photodiode 102 by a control pulse SHT being applied to a gate electrode 252A.

Note that the state in which the control pulse SHT is applied to the gate electrode 252A will be hereinafter also referred to as a state in which the shutter gate 252 is turned on. Furthermore, the state in which the control pulse SHT is not applied to the gate electrode 252A will be hereinafter also referred to as a state in which the shutter gate 252 is turned off.

The second charge drain unit 253 includes an N-type layer having an impurity concentration at which a contact for wiring can be connected. The second charge drain unit 253 is connected to a power source Vofd, and the potential of the second charge drain unit 253 is substantially equal to that of the power source Vofd. Charge that has been transferred from the photodiode 102 to the second charge drain unit 253 by the shutter gate 252 is drained to the power source Vofd. This causes the photodiode 102 to be reset.

The height of the potential barrier ABG between the transfer region 211 and the charge drain unit 202 is controlled by the variable power source voltage Vofd. Specifically, as illustrated in the lower figure of FIG. 18, in a case where the power supply voltage Vofd is increased, the potential barrier ABG between the transfer region 211 and the charge drain unit 202 is depleted and lowered. Then, the charge of the transfer region 211 exceeds the potential barrier ABG, and is transferred to the charge drain unit 202.

As described above, in the pixel 31c, the height of the potential barrier ABG is controlled by voltage without using the charge drain gate 214, and thereby the charge of the transfer region 211 is drained to the charge drain unit 202.

Note that the height of the potential barrier ABG is adjusted by the power source voltage Vofd and the impurity concentration between the transfer region 211 and the charge drain unit 202.

4. Third Embodiment

Next, a third embodiment of the present technology will be described with reference to FIGS. 19 and 20.

<Configuration Example of Pixel 31d>

Figure 19:
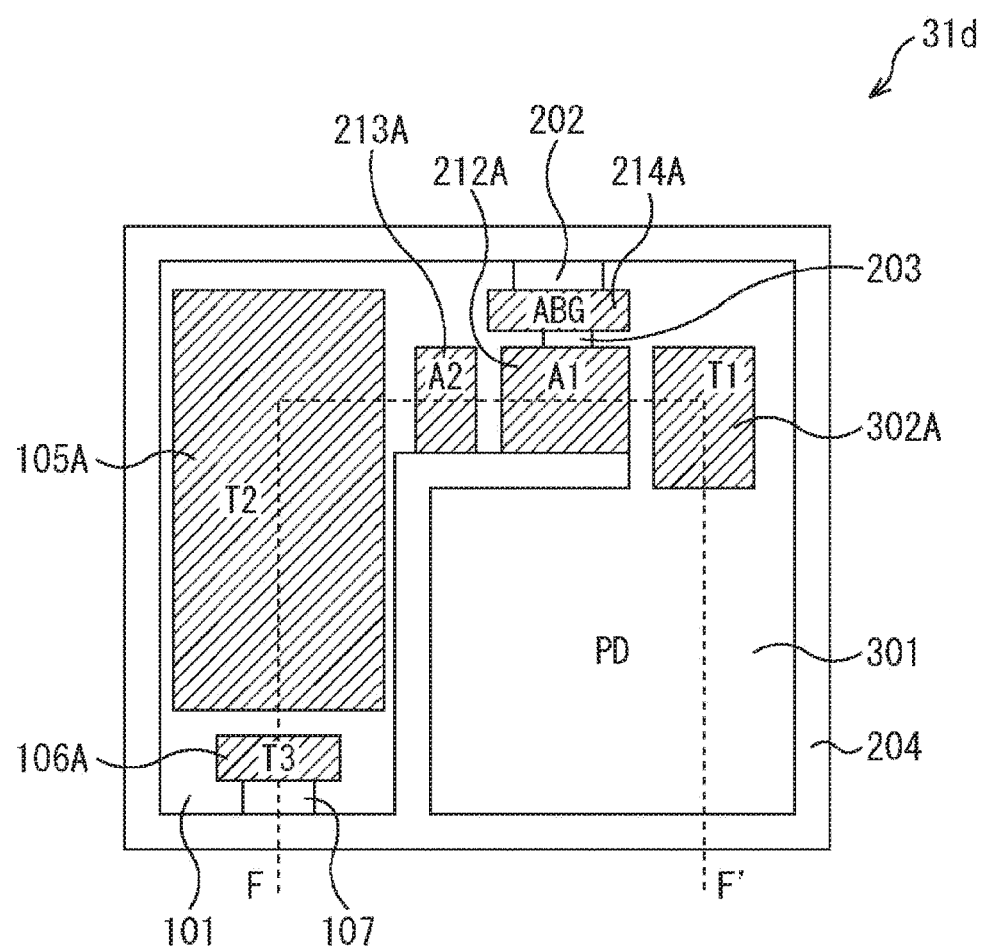
FIG. 19 is a plan view schematically illustrating a configuration example of a third embodiment of the unit pixel in FIG. 1.
Figure 20:
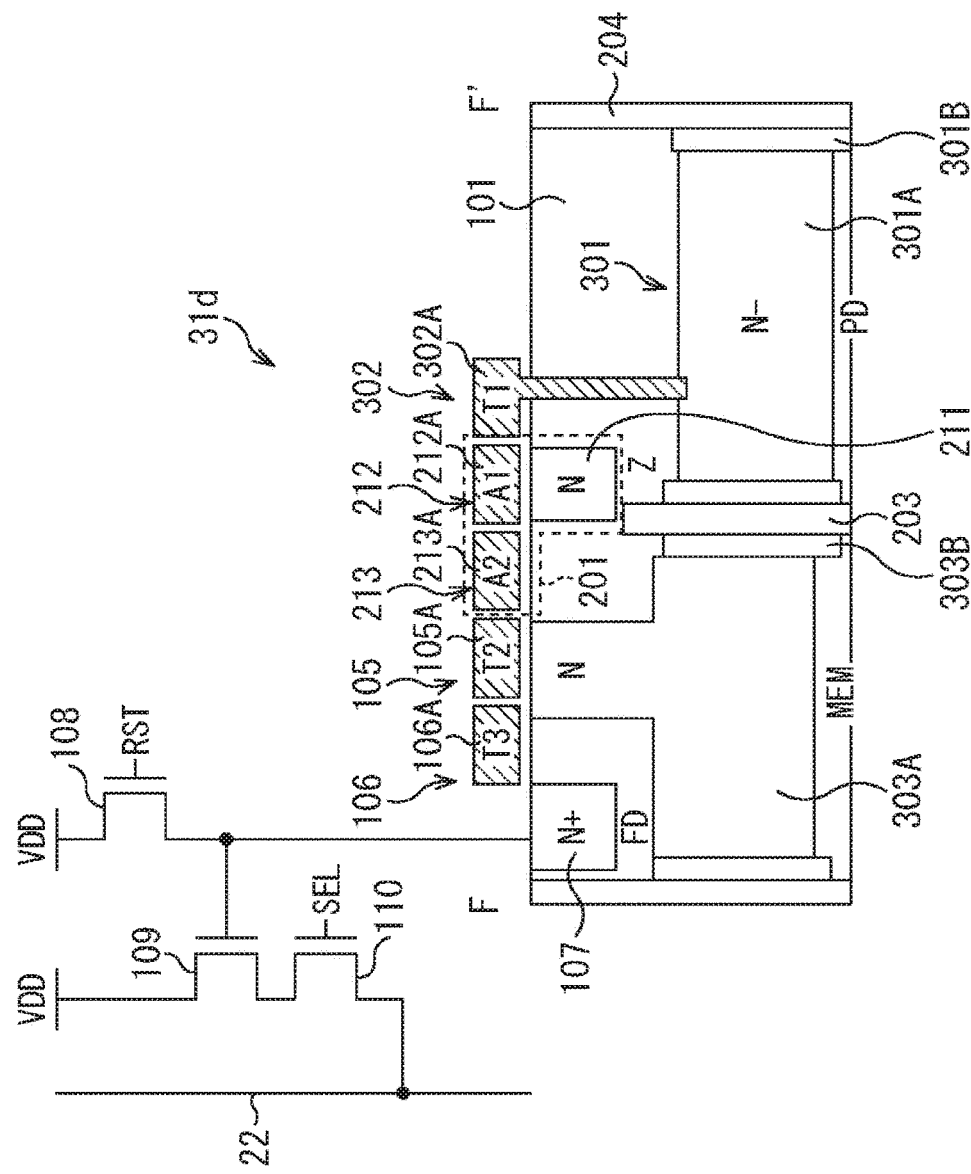
FIG. 20 is a cross-sectional view schematically illustrating a configuration example of the third embodiment of the unit pixel in FIG. 1.

FIGS. 19 and 20 illustrate a configuration example of a pixel 31d, which is the third embodiment of the pixel 31 of the pixel array unit 11 in FIG. 1. FIG. 19 is a schematic plan view of the pixel 31d. FIG. 20 schematically illustrates a configuration example of a cross section of the pixel 31d in an F-F' direction in FIG. 19. Although only one pixel 31d is illustrated in FIGS. 19 and 20, other pixels basically have a similar configuration.

Note that, in the figures, the same sign is attached to a part corresponding to the pixel 31b in FIGS. 6 and 8, and the description thereof will be appropriately omitted.

The pixel 31d is different from the pixel 31b in that the semiconductor substrate 101 is thicker, and a photodiode 301, a first transfer gate 302, and a charge holding unit 303 are provided instead of the photodiode 102, the first transfer gate 103, and the charge holding unit 104.

In a case where the CMOS image sensor 1 is of the back-surface irradiated type, the photodiode and the charge holding unit can be disposed at a deep position in the semiconductor substrate 101, which is separated from the circuit surface of the semiconductor substrate 101 by a predetermined distance or more.

Specifically, the photodiode 301 includes an N-type layer 301A and an element separation layer 301B. The N-type layer 301A is formed at a deep position in the semiconductor substrate 101, which is separated from the circuit surface of the semiconductor substrate 101 by a predetermined distance or more. The element separation layer 301B including a P-type layer covers a side surface of the N-type layer 301A.

The area of the joint surface between the N-type layer 301A and the element separation layer 301B can be larger than the area of the joint surface between the P-type layer 102A and the N-type layer 102B of the photodiode 102 in FIG. 3. Consequently, the saturation charge amount of the photodiode 301 can be made larger than that of the photodiode 102 in FIG. 3 by increasing the impurity concentration of the element separation layer 301B and increasing the electric field between the N-type layer 301A and the element separation layer 301B.

Furthermore, a gate electrode 302A of the first transfer gate 302 including a vertical transistor is disposed at a position overlapping the N-type layer 301A in a direction vertical to the circuit surface of the semiconductor substrate 101. The gate electrode 302A has a trench shape, and the end of the trench part reaches the upper surface of the N-type layer 301A.

The first transfer gate 302 transfers charge accumulated in the photodiode 301 by a control pulse T1 being applied to the gate electrode 302A.

Note that the state in which the control pulse T1 is applied to the gate electrode 302A will be hereinafter also referred to as a state in which the first transfer gate 302 is turned on. Furthermore, the state in which the control pulse T1 is not applied to the gate electrode 302A will be hereinafter also referred to as a state in which the first transfer gate 302 is turned off.

As described above, in the pixel 31d, a transistor such as the first transfer gate 302 can be disposed above the N-type layer 301A constituting the photodiode 301 on the circuit surface of the semiconductor substrate 101. This enables the number and area of transistors capable of being disposed on the circuit surface of the semiconductor substrate 101 to be increased.

The charge holding unit 303 includes an N-type layer 303A and an element separation layer 303B. Similarly to the N-type layer constituting the charge holding unit 104 in FIG. 3, the N-type layer 303A is disposed below the gate electrode 105A, and spreads to the lower part of the gate electrode 213A and to the lower part of the FD 107 at a deep position of the semiconductor substrate 101. This causes the volume of the charge holding unit 303 and the saturation charge amount to be increased.

Furthermore, the element separation layer 303B including a P-type layer covers the side surface of a part spreading at a deep position of the semiconductor substrate 101 of the N-type layer 303A. Then, the saturation charge amount of the charge holding unit 303 can be further increased by increasing the impurity concentration of the element separation layer 303B and increasing the electric field between the N-type layer 303A and the element separation layer 303B.

Note that, for example, in a case where a shutter gate is provided in a pixel 301d similarly to the pixel 31c in FIG. 16, the shutter gate includes, for example, a vertical transistor similarly to the first transfer gate 302.

5. Fourth Embodiment

Next, a fourth embodiment of the present technology will be described with reference to FIGS. 21 and 22.

<Configuration Example of Pixel 31e>

Figure 21:
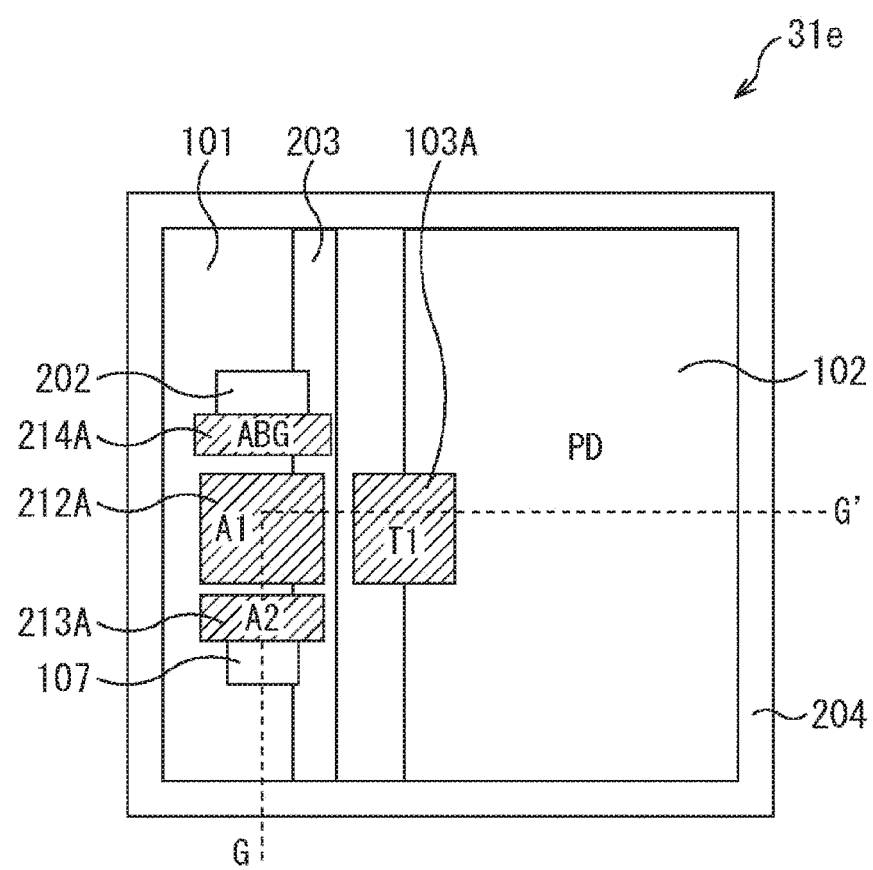
FIG. 21 is a plan view schematically illustrating a configuration example of a fourth embodiment of the unit pixel in FIG. 1.
Figure 22:
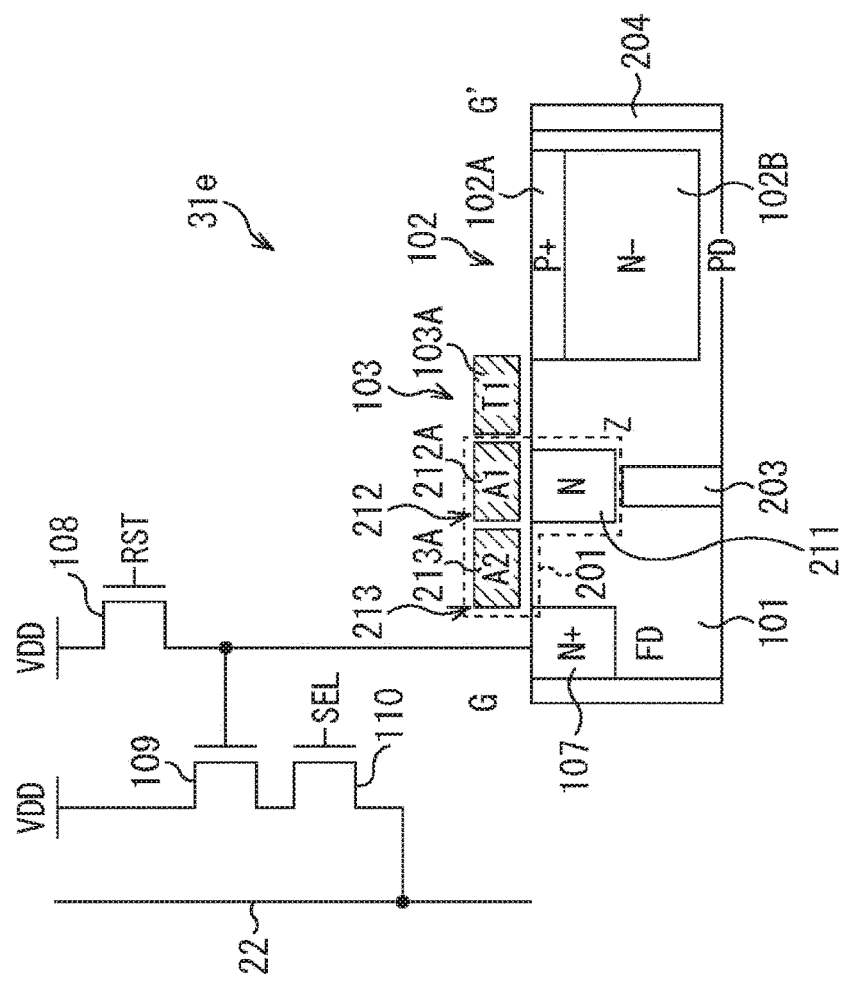
FIG. 22 is a cross-sectional view schematically illustrating a configuration example of the fourth embodiment of the unit pixel in FIG. 1.

FIGS. 21 and 22 illustrate a configuration example of a pixel 31e, which is the fourth embodiment of the pixel 31 of the pixel array unit 11 in FIG. 1. FIG. 21 is a schematic plan view of the pixel 31e. FIG. 22 schematically illustrates a configuration example of a cross section of the pixel 31e in a G-G' direction in FIG. 21. Although only one pixel 31e is illustrated in FIGS. 21 and 22, other pixels basically have a similar configuration.

Note that, in the figures, the same sign is attached to a part corresponding to the pixel 31b in FIGS. 6 and 8, and the description thereof will be appropriately omitted.

The pixel 31e is different from the pixel 31b in that the charge holding unit 104, the second transfer gate 105, and the third transfer gate 106 are deleted.

That is, in the pixel 31e, the FD 107 holds charge transferred from the transfer region 211 by the fifth transfer gate 213, and converts the charge into voltage.

The separation unit 203 is disposed below the transfer region 211, and electrically separates the photodiode 102 and the FD 107.

The pixel 31e is different from the pixel 31b in that the light receiving area of the photodiode 102 can be increased and light receiving sensitivity can be improved.

Furthermore, in the pixel 31e, interference between the photodiode 102 and the FD 107 can be prevented similarly to the pixels 31b to 31d.

6. Variations

Variations of the above-mentioned embodiments of the present technology will be described below.

For example, the above-mentioned first to fourth embodiments can be combined. For example, the second or third embodiment and the fourth embodiment may be combined, and the charge holding unit 104 may be omitted in the pixel 31c or 31d to transfer charge of the photodiode 102 to the FD 107. For example, a photodiode may be disposed at a deep position of the semiconductor substrate 101 in the pixel 31c by combining the second and third embodiments.

Furthermore, for example, the first transfer gate 103 and the fourth transfer gate 212 can be combined into one transfer gate, and the gate electrode 103A and the gate electrode 212A can be combined into one gate electrode.

Furthermore, the present technology can be applied to structures other than the unit pixels described in the above-mentioned embodiments. For example, the present technology can be applied to the case where two or more charge holding units are provided in one pixel.

Furthermore, all pixels in the embodiments of the present technology mean all pixels in a part appearing in an image, and dummy pixels and the like are excluded.

Furthermore, if time difference and image distortion are small enough not to cause a problem, high-speed scanning in units of a plurality of rows (e.g., several tens of rows) can be performed instead of simultaneously operating all pixels. Furthermore, the global shutter operation can be applied not only to all pixels appearing in an image but to a predetermined plurality of rows.

Moreover, the conductivity type of the device structure of the pixel 31 illustrated above is merely one example. The N type and P type may be reversed, and the conductivity type of the semiconductor substrate 101 may be either N type or P type. Note that the magnitude relation of the potential of each of the above-mentioned parts may be reversed depending on whether majority carriers moving in a pixel are holes or electrons.

Moreover, in addition to the CMOS image sensor, the present technology can be applied to general imaging devices that perform the global shutter operation. The imaging devices include, in a pixel, a photoelectric conversion unit and an element that holds charge transferred from the photoelectric conversion unit.

7. Applications

Next, applications of the present technology will be described.

<Applications of Present Technology>

Figure 23:
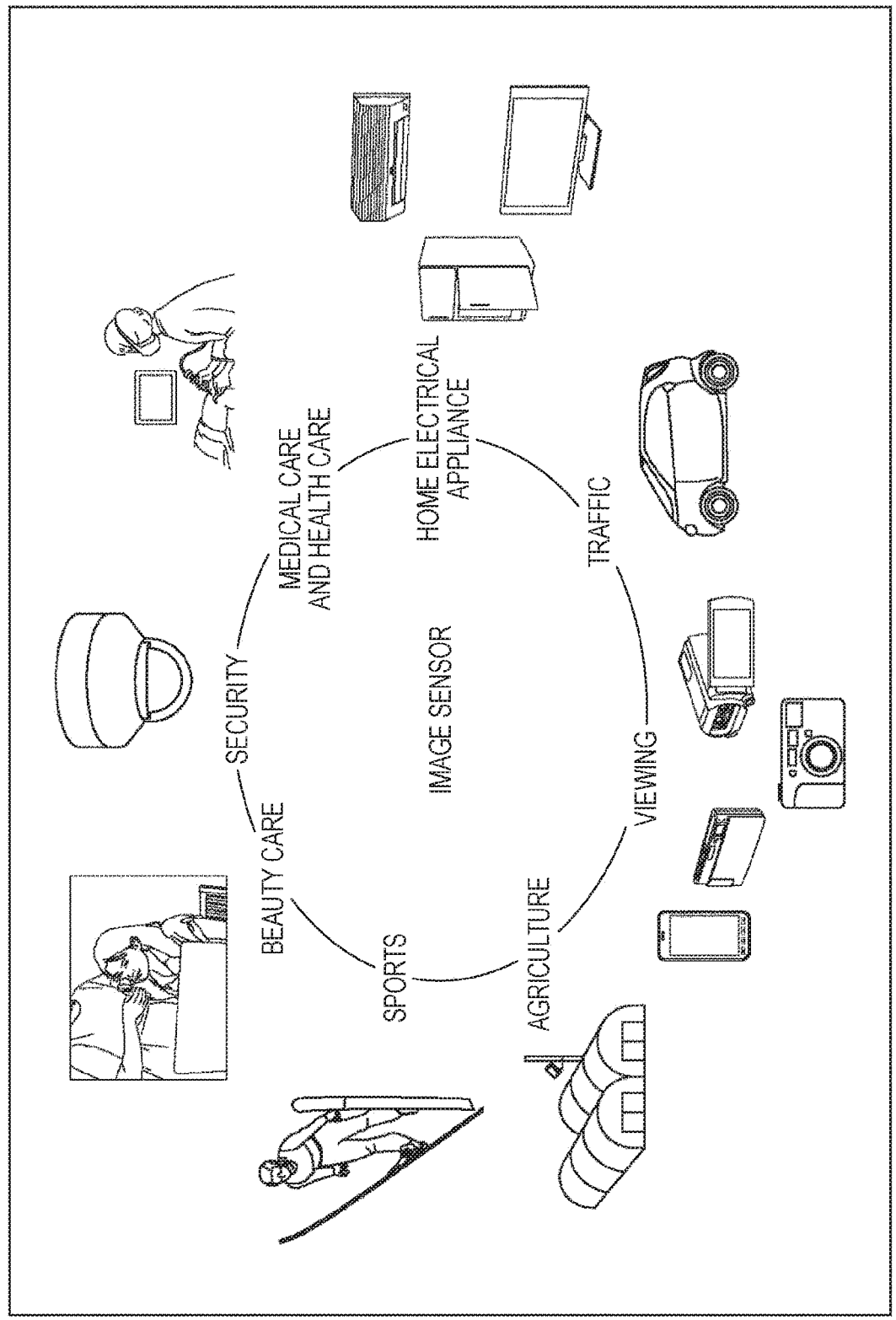
FIG. 23 illustrates an application of the present technology.

For example, as illustrated in FIG. 23, the present technology can be applied to various cases of sensing light such as visible light, infrared light, ultraviolet light, and X-rays.

An apparatus that captures an image provided for viewing, such as a digital camera and a portable instrument with a camera function An apparatus provided for traffic, such as an in-vehicle sensor, a monitoring camera, and a distance measurement sensor, the in-vehicle sensor capturing an image of, for example, the front, back, surroundings, and inside of an automobile for safe driving such as automatic stop, recognition of the state of a driver, and the like, the monitoring camera monitoring a running vehicle and a road, the distance measurement sensor measuring a distance between, for example, vehicles An apparatus provided for a home electrical appliance such as a TV, a refrigerator, and an air conditioner for capturing an image of a gesture of a user and operating an instrument in accordance with the gesture An apparatus provided for medical care and health care, such as an endoscope and an apparatus for capturing an image of a blood vessel by receiving infrared light An apparatus provided for security, such as a monitoring camera for security and a camera for person authentication An apparatus provided for beauty care, such as a skin measuring instrument for capturing an image of skin and a microscope for capturing an image of a scalp An apparatus provided for sports, such as an action camera and a wearable camera for sports and the like An apparatus provided for agriculture, such as a camera for monitoring the states of a field and crops <Application to Electronic Equipment>

Figure 24:
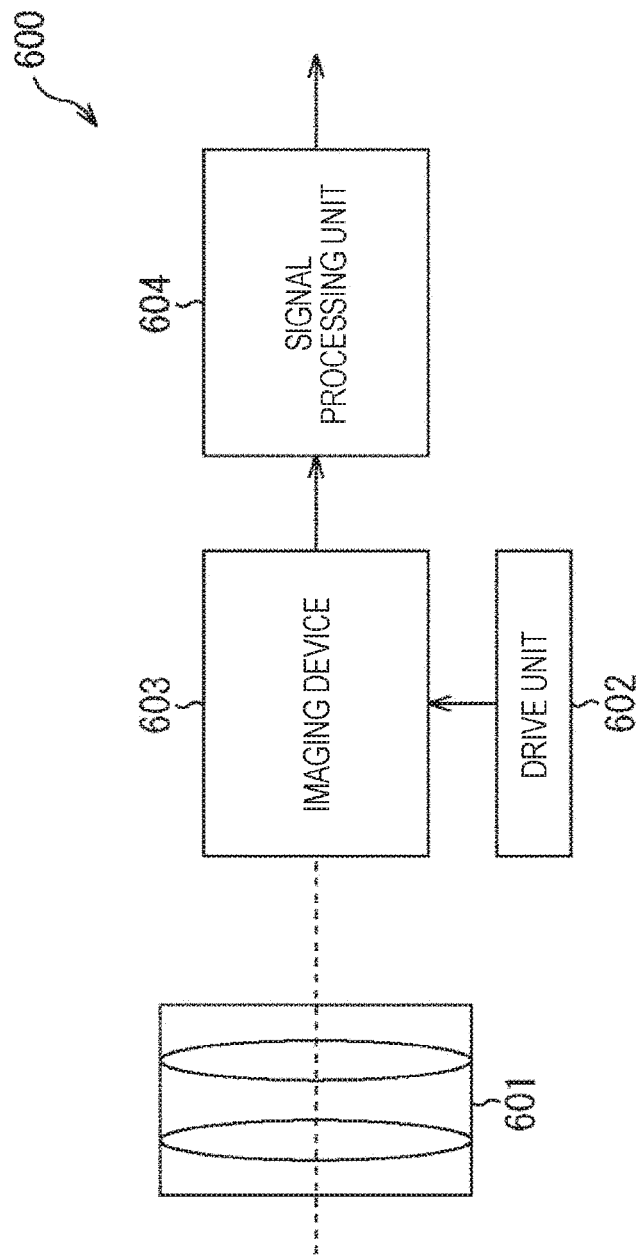
FIG. 24 is a block diagram illustrating a configuration example of electronic equipment.

FIG. 24 illustrates a configuration example of electronic equipment to which the present technology is applied.

Electronic equipment 600 includes an optical system configuration unit 601, a drive unit 602, an imaging device 603, and a signal processing unit 604.

The optical system configuration unit 601 includes, for example, an optical lens, and causes an optical image of a subject to enter the imaging device 603. The drive unit 602 controls the driving of the imaging device 603 by generating and outputting various timing signals related to the driving inside the imaging device 603. The signal processing unit 604 performs predetermined signal processing on an image signal output from the imaging device 603, and performs processing in accordance with the signal processing result. Furthermore, the signal processing unit 604 outputs an image signal as a result of the signal processing to a subsequent stage.

For example, the signal processing unit 604 records the image signal in a recording medium such as a solid-state memory, and transfers the image signal to a predetermined server via a predetermined network.

Here, the quality of a captured image can be improved by using the above-mentioned CMOS image sensor 1 as the imaging device 603.

Note that the embodiments of the present technology are not limited to the above-mentioned embodiments, and various modifications are possible without departing from the spirit of the present technology.

<Examples of Combination of Configuration>

Furthermore, for example, the present technology can also have the configurations as follows.

(1)

An imaging device including, in a pixel:
a photoelectric conversion unit;
a charge transfer unit;
a first electrode that is used to transfer charge from the photoelectric conversion unit to the charge transfer unit;
a charge-voltage conversion unit; and
a first charge drain unit, in which the charge transfer unit is allowed to transfer charge in a first transfer direction to the charge-voltage conversion unit and a second transfer direction to the first charge drain unit.

(2)

The imaging device according to (1), in which the charge transfer unit includes:

a transfer channel region that is a region having a same polarity as a region for accumulating charge of the photoelectric conversion unit, charge that has been transferred from the photoelectric conversion unit by using the first electrode flowing into the region;

a second electrode that is used to control potential of the transfer channel region; and a third electrode that is used to transfer charge from the transfer channel region in the first transfer direction.

(3)

The imaging device according to (2), further including, in the pixel:

a charge holding unit that is disposed between the charge transfer unit and the charge-voltage conversion unit in the first transfer direction, and that holds charge that has been transferred from the transfer channel region by using the third electrode; and a fourth electrode that is used to transfer charge from the charge holding unit to the charge-voltage conversion unit.

(4)

The imaging device according to (2), in which charge is transferred from the transfer channel region to the charge-voltage conversion unit by using the third electrode.

(5)

The imaging device according to any one of (2) to (4), in which the charge transfer unit further includes a fifth electrode that is used to transfer charge from the transfer channel region to the first charge drain unit.

(6)

The imaging device according to any one of (2) to (4), in which variable voltage is applied to the first charge drain unit, and potential of a potential barrier between the transfer channel region and the first charge drain unit is varied by the voltage applied to the first charge drain unit.

(7)

The imaging device according to (6), further including, in the pixel:

a second charge drain unit; and a sixth electrode that is used to transfer charge from the photoelectric conversion unit to the second charge drain unit.

(8)

The imaging device according to any one of (2) to (7), further including:

a separation unit that electrically separates the photoelectric conversion unit and the charge-voltage conversion unit between a surface and the transfer channel region, the surface being opposite to a surface on which the first electrode of a semiconductor substrate is provided, the photoelectric conversion unit being formed in the semiconductor substrate.

(9)

The imaging device according to any one of (2) to (8)

in which one electrode constitutes the first electrode and the second electrode.

(10)

The imaging device according to any one of (1) to (9), in which a circuit surface is separated from the photoelectric conversion unit by a predetermined distance or more, the first electrode of the semiconductor substrate being provided on the circuit surface, the photoelectric conversion unit being formed in the semiconductor substrate.

(11)

The imaging device according to (10), in which the first electrode is disposed at a position overlapping the photoelectric conversion unit in a direction vertical to the circuit surface of the semiconductor substrate.

(12)

Electronic equipment including:

an imaging device; and a signal processing unit that processes a signal output from the imaging device, in which the imaging device includes, in a pixel:

a photoelectric conversion unit;

a charge transfer unit;

an electrode that is used to transfer charge from the photoelectric conversion unit to the charge transfer unit;

a charge-voltage conversion unit; and a charge drain unit, and the charge transfer unit is allowed to transfer charge in a first transfer direction to the charge-voltage conversion unit and a second transfer direction to the charge drain unit.

Note that, the effects described in the specification are merely illustrations, and are not limited. Other effects may be exhibited.

REFERENCE SIGNS LIST

1 CMOS image sensor
11 Pixel array unit
12 Vertical drive unit
13 Horizontal transfer unit
14 Signal processing unit
31, 31a to 31e Pixel
41 Signal processing unit
101 Semiconductor substrate
102 Photodiode
102B N-type layer
103 First transfer gate
103A Gate electrode
104 Charge holding unit
105 Second transfer gate
105A Gate electrode
106 Third transfer gate
106A Gate electrode
107 FD
201 Charge transfer unit
202 Charge drain unit
203 Separation unit
204 DTI
211 Transfer region
212 Fourth transfer gate
212A Gate electrode
213 Fifth transfer gate
213A Gate electrode
214 Charge drain gate
214A Gate electrode
251 Charge transfer unit
252 Reset gate
252A Gate electrode
253 Second charge drain unit
301 Photodiode
301A N-type layer
302 First transfer gate
302A Gate electrode 303 Charge holding unit
600 Electronic equipment
603 Imaging device
604 Signal processing unit

What is claimed is:

1. An imaging device comprising, in a pixel:
a photoelectric conversion unit;
a charge transfer unit;
a first electrode that is used to transfer charge from the photoelectric conversion unit to the charge transfer unit;
a charge-voltage conversion unit; and
a first charge drain unit,
wherein the charge transfer unit is allowed to transfer charge in a first transfer direction to the charge-voltage conversion unit and a second transfer direction to the first charge drain unit.

2. The imaging device according to claim 1,
wherein the charge transfer unit includes:
a transfer channel region that is a region having a same polarity as a region for accumulating charge of the photoelectric conversion unit, charge that has been transferred from the photoelectric conversion unit by using the first electrode flowing into the region;
a second electrode that is used to control potential of the transfer channel region; and
a third electrode that is used to transfer charge from the transfer channel region in the first transfer direction.

3. The imaging device according to claim 2, further comprising, in the pixel:
a charge holding unit that is disposed between the charge transfer unit and the charge-voltage conversion unit in the first transfer direction, and that holds charge that has been transferred from the transfer channel region by using the third electrode; and
a fourth electrode that is used to transfer charge from the charge holding unit to the charge-voltage conversion unit.

4. The imaging device according to claim 2,
wherein charge is transferred from the transfer channel region to the charge-voltage conversion unit by using the third electrode.

5. The imaging device according to claim 2,
wherein the charge transfer unit further includes a fifth electrode that is used to transfer charge from the transfer channel region to the first charge drain unit.

6. The imaging device according to claim 2,
wherein variable voltage is applied to the first charge drain unit, and potential of a potential barrier between the transfer channel region and the first charge drain unit is varied by the voltage applied to the first charge drain unit.

7. The imaging device according to claim 6, further comprising, in the pixel:
a second charge drain unit; and
a sixth electrode that is used to transfer charge from the photoelectric conversion unit to the second charge drain unit.

8. The imaging device according to claim 2, further comprising:
a separation unit that electrically separates the photoelectric conversion unit and the charge-voltage conversion unit between a surface and the transfer channel region, the surface being opposite to a surface on which the first electrode of a semiconductor substrate is provided, the photoelectric conversion unit being formed in the semiconductor substrate.

9. The imaging device according to claim 2,
wherein one electrode constitutes the first electrode and the second electrode.

10. The imaging device according to claim 1,
wherein a circuit surface is separated from the photoelectric conversion unit by a predetermined distance or more, the first electrode being provided on a circuit surface of a semiconductor substrate, the photoelectric conversion unit being formed in the semiconductor substrate.

11. The imaging device according to claim 10,
wherein the first electrode is disposed at a position overlapping the photoelectric conversion unit in a direction vertical to the circuit surface of the semiconductor substrate.

12. Electronic equipment comprising:
an imaging device; and
a signal processing unit that processes a signal output from the imaging device,
wherein the imaging device includes, in a pixel:
a photoelectric conversion unit;
a charge transfer unit;
an electrode that is used to transfer charge from the photoelectric conversion unit to the charge transfer unit;
a charge-voltage conversion unit; and
a charge drain unit, and
the charge transfer unit is allowed to transfer charge in a first transfer direction to the charge-voltage conversion unit and a second transfer direction to the charge drain unit.

* * * * *